(12) United States Patent
Takeda et al.

(10) Patent No.: US 11,145,766 B2
(45) Date of Patent: Oct. 12, 2021

(54) ACTIVE-MATRIX SUBSTRATE AND DISPLAY DEVICE

(71) Applicant: Sharp Kabushiki Kaisha, Sakai (JP)

(72) Inventors: Yujiro Takeda, Sakai (JP); Hiroshi Matsukizono, Sakai (JP); Akihiro Oda, Sakai (JP); Shogo Murashige, Sakai (JP); Kohhei Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 42 days.

(21) Appl. No.: 16/619,532

(22) PCT Filed: Jun. 4, 2018

(86) PCT No.: PCT/JP2018/021389
§ 371 (c)(1),
(2) Date: Dec. 5, 2019

(87) PCT Pub. No.: WO2018/225690
PCT Pub. Date: Dec. 13, 2018

(65) Prior Publication Data
US 2020/0152802 A1    May 14, 2020

(30) Foreign Application Priority Data
Jun. 8, 2017   (JP) .............................. JP2017-113268

(51) Int. Cl.
*H01L 29/786* (2006.01)
*H01L 27/12* (2006.01)
(Continued)

(52) U.S. Cl.
CPC ...... *H01L 29/78696* (2013.01); *H01L 27/127* (2013.01); *H01L 27/1225* (2013.01);
(Continued)

(58) Field of Classification Search
CPC .......... H01L 29/78696; H01L 27/1225; H01L 27/127; H01L 27/1288; H01L 29/24;
(Continued)

(56) References Cited

U.S. PATENT DOCUMENTS 8,513,661 B2 *   8/2013   Takahashi ........... H01L 29/7869
                                                                    257/43
8,637,863 B2 *   1/2014   Yamazaki ........... H01L 27/1225
                                                                    257/43
(Continued)

FOREIGN PATENT DOCUMENTS

JP    2006-119404 A    5/2006
JP    2008-040343 A    2/2008
(Continued)

*Primary Examiner* — Vu A Vu
(74) *Attorney, Agent, or Firm* — Keating & Bennett, LLP

(57) ABSTRACT

An active matrix substrate of an embodiment of the present invention includes a substrate and a plurality of oxide semiconductor TFTs supported on the substrate. Each oxide semiconductor TFT includes a lower gate electrode provided on the substrate, a gate insulating layer covering the lower gate electrode, an oxide semiconductor layer provided on the gate insulating layer, a source electrode which is in contact with the source contact region of the oxide semiconductor layer, a drain electrode which is in contact with the drain contact region of the oxide semiconductor layer, an insulating layer covering the oxide semiconductor layer, the source electrode and the drain electrode, and an upper gate electrode provided on the insulating layer. When viewed in a normal direction of the substrate, the upper gate electrode does not overlap a first electrode which is one of the source electrode and the drain electrode, and a second electrode which is the other of the source electrode and the drain electrode does not overlap the lower gate electrode.

13 Claims, 12 Drawing Sheets

(51) Int. Cl.
*H01L 29/24* (2006.01)
*H01L 29/66* (2006.01)
*G02F 1/1368* (2006.01)
*G09G 3/36* (2006.01)

(52) U.S. Cl.
CPC .......... *H01L 27/1288* (2013.01); *H01L 29/24* (2013.01); *H01L 29/66969* (2013.01); *H01L 29/7869* (2013.01); *H01L 29/78648* (2013.01); *G02F 1/1368* (2013.01); *G09G 3/3688* (2013.01); *G09G 2310/0297* (2013.01)

(58) Field of Classification Search
CPC ......... H01L 29/66969; H01L 29/78648; H01L 29/7869; H01L 29/78624; H01L 21/8234; H01L 27/088; G02F 1/1368; G09G 3/3688; G09G 2310/0297; G09F 9/30
USPC .......................................................... 257/43
See application file for complete search history.

(56) References Cited

U.S. PATENT DOCUMENTS

| | | |
|---|---|---|
| 2008/0035920 A1 | 2/2008 | Takechi et al. |
| 2008/0225024 A1 | 9/2008 | Ito |
| 2011/0109351 A1 | 5/2011 | Yamazaki et al. |
| 2012/0138922 A1 | 6/2012 | Yamazaki et al. |
| 2013/0038518 A1 | 2/2013 | Tagawa et al. |
| 2013/0320334 A1 | 12/2013 | Yamazaki et al. |
| 2014/0286076 A1 | 9/2014 | Aoki et al. |
| 2017/0317217 A1 | 11/2017 | Ito et al. |

FOREIGN PATENT DOCUMENTS

| | | |
|---|---|---|
| JP | 2008-225036 A | 9/2008 |
| JP | 2012-134475 A | 7/2012 |
| JP | 2014-007399 A | 1/2014 |
| JP | 2014-209727 A | 11/2014 |
| JP | 2016-184739 A | 10/2016 |
| WO | 2011/118079 A1 | 9/2011 |
| WO | 2016/076168 A1 | 5/2016 |

* cited by examiner (a)

(b)

(a)

COMPARATIVE EXAMPLE: GATE SIGNAL (b)

EMBODIMENT 1: GATE SIGNAL (a)

(b)

ACTIVE-MATRIX SUBSTRATE AND DISPLAY DEVICE

TECHNICAL FIELD

The present invention relates to an active matrix substrate and particularly to an active matrix substrate which includes oxide semiconductor TFTs. The present invention also relates to a display device which includes such an active matrix substrate.

BACKGROUND ART

Display devices which include an active matrix substrate which includes switching elements in respective pixels have been widely used. An active matrix substrate which includes thin film transistors (hereinafter, "TFT(s)") as switching elements is referred to as a TFT substrate. In this specification, a region of the TFT substrate corresponding to a pixel of the display device is also referred to as a pixel. A TFT which is provided as a switching element in each pixel of an active matrix substrate is referred to as "pixel TFT".

There is a case where a peripheral circuit such as a driver circuit is monolithically (integrally) formed on an active matrix substrate. In this case, TFTs which are constituents of the peripheral circuit are referred to as "circuit TFTs".

In recent years, using an oxide semiconductor as a material of the active layer of TFTs, instead of amorphous silicon and polycrystalline silicon, has been proposed. Such a TFT is referred to as "oxide semiconductor TFT". The oxide semiconductor has higher mobility than the amorphous silicon. Therefore, oxide semiconductor TFTs are capable of higher speed operation than amorphous silicon TFTs. Further, oxide semiconductor films can be formed through a simpler and more convenient process than polycrystalline silicon films and are therefore applicable to devices which require large surfaces.

For example, the mobility of an In—Ga—Zn—O based oxide semiconductor (In:Ga:Zn=1:1:1) is higher than that of amorphous silicon (about 20 times) but presently lower than that of polycrystalline silicon. Therefore, when oxide semiconductor TFTs are used as the pixel TFTs, there is a probability that the ON current will decrease as compared with a case where polycrystalline silicon TFTs are used. A possible solution for increase of the ON current is, for example, applying a "double gate configuration" to the oxide semiconductor TFTs. In this specification, a configuration where each of the substrate side and the opposite side of the oxide semiconductor layer is provided with a gate electrode is referred to as "double gate configuration". The gate electrode provided on the substrate side of the oxide semiconductor layer is referred to as "lower gate electrode", and the gate electrode provided above the oxide semiconductor layer is referred to as "upper gate electrode".

Active matrix substrates which include oxide semiconductor TFTs of the double gate configuration are disclosed in, for example, Patent Document No. 1 and Patent Document No. 2.

CITATION LIST

Patent Literature

Patent Document No. 1: WO 2016/076168
Patent Document No. 2: Japanese Laid-Open Patent Publication No. 2016-184739

SUMMARY OF INVENTION

Technical Problem

However, the oxide semiconductor TFT of the double gate configuration has improved TFT characteristics (increased ON current) but has increased parasitic capacitance due to its configuration and, therefore, it is difficult to put it into practical use. The increase of the parasitic capacitance is attributed to formation of the parasitic capacitance (static capacitance) between the lower gate electrode and the source/drain electrodes and formation of the parasitic capacitance (static capacitance) between the upper gate electrode and the source/drain electrodes.

Patent Document No. 2 discloses the technique of controlling the electrical characteristics of the oxide semiconductor TFT by adjusting the potentials of the lower gate electrode and the upper gate electrode. According to the technique of Patent Document No. 2, oxide semiconductor TFTs which have different electrical characteristics can be formed on the same substrate. However, Patent Document No. 2 includes no reference to the above-described problem (increase of the parasitic capacitance). Even an oxide semiconductor TFT formed using the technique of Patent Document No. 2 has the problem of large parasitic capacitance.

The present invention was conceived in view of the above-described problems. An object of the present invention is to reduce the parasitic capacitance in the oxide semiconductor TFTs of the double gate configuration.

Solution to Problem

An active matrix substrate of an embodiment of the present invention has a display region defined by a plurality of pixel regions, the active matrix substrate including a substrate and a plurality of oxide semiconductor TFTs supported on the substrate, wherein each of the plurality of oxide semiconductor TFTs includes a lower gate electrode provided on the substrate, a gate insulating layer covering the lower gate electrode, an oxide semiconductor layer provided on the gate insulating layer, the oxide semiconductor layer overlapping the lower gate electrode with the gate insulating layer interposed therebetween, the oxide semiconductor layer including a channel region and a source contact region and a drain contact region which are present on opposite sides of the channel region, a source electrode which is in contact with the source contact region of the oxide semiconductor layer, a drain electrode which is in contact with the drain contact region of the oxide semiconductor layer, an insulating layer covering the oxide semiconductor layer, the source electrode and the drain electrode, and an upper gate electrode provided on the insulating layer, the upper gate electrode overlapping the oxide semiconductor layer with the insulating layer interposed therebetween, and wherein when viewed in a normal direction of the substrate, the upper gate electrode does not overlap a first electrode which is one of the source electrode and the drain electrode, and a second electrode which is the other of the source electrode and the drain electrode does not overlap the lower gate electrode.

In one embodiment, the upper gate electrode is arranged such that a static capacitance formed between the upper gate electrode and the first electrode is not more than 80% of a static capacitance formed between the upper gate electrode and the second electrode, and the second electrode is arranged such that a static capacitance formed between the second electrode and the lower gate electrode is not more than 80% of a static capacitance formed between the first electrode and the lower gate electrode.

In one embodiment, when viewed in the normal direction of the substrate, an end of the upper gate electrode on the first electrode side and an end of the first electrode on the upper gate electrode side are spaced away from each other by 2 µm or more.

In one embodiment, when viewed in the normal direction of the substrate, an end of the second electrode on the lower gate electrode side and an end of the lower gate electrode on the second electrode side are spaced away from each other by 2 µm or more.

In one embodiment, a thickness of the oxide semiconductor layer is not more than 10 µm.

In one embodiment, the plurality of oxide semiconductor TFTs include a plurality of pixel TFTs provided in the plurality of pixel regions.

In one embodiment, the active matrix substrate has a non-display region lying around the display region, the active matrix substrate further includes a peripheral circuit provided in the non-display region, the plurality of oxide semiconductor TFTs include a plurality of first TFTs provided in the non-display region and included in the peripheral circuit and a plurality of second TFTs provided in the display region or the non-display region, the oxide semiconductor layer of the plurality of first TFTs and the oxide semiconductor layer of the plurality of second TFTs are formed by an identical oxide semiconductor film, and a carrier density in the channel region of the plurality of first TFTs is higher than a carrier density in the channel region of the plurality of second TFTs.

In one embodiment, a carrier density in the channel region of the plurality of first TFTs is not less than $1\times10^{17}/cm^3$ and not more than $1\times10^{19}/cm^3$.

In one embodiment, a carrier density in the channel region of the plurality of first TFTs is not less than 10 times and not more than 1000 times a carrier density in the channel region of the plurality of second TFTs.

In one embodiment, the insulating layer includes a silicon oxide layer which is in contact with the channel region of the plurality of first TFTs and the channel region of the plurality of second TFTs, and a first part of the silicon oxide layer which is present on the plurality of first TFTs contains hydrogen at a higher concentration than the second part which is present on the plurality of second TFTs.

In one embodiment, a threshold voltage of the plurality of first TFTs is lower than a threshold voltage of the plurality of second TFTs.

In one embodiment, a threshold voltage of the plurality of first TFTs is negative, and a threshold voltage of the plurality of second TFTs is positive.

In one embodiment, the plurality of second TFTs include a plurality of pixel TFTs provided in the plurality of pixel regions.

In one embodiment, the active matrix substrate of the present invention further includes a driving circuit provided in the non-display region, and the plurality of second TFTs include TFTs which are constituents of the driving circuit.

In one embodiment, the peripheral circuit is a demultiplexer circuit.

In one embodiment, the oxide semiconductor layer includes an In—Ga—Zn—O based semiconductor.

In one embodiment, the In—Ga—Zn—O based semiconductor includes a crystalline portion.

A display device of an embodiment of the present invention includes the active matrix substrate as set forth in any of the foregoing paragraphs.

Advantageous Effects of Invention

According to an embodiment of the present invention, the parasitic capacitance in the oxide semiconductor TFTs of the double gate configuration can be reduced.

DESCRIPTION OF EMBODIMENTS

Embodiment 1

Hereinafter, an active matrix substrate of the present embodiment is described with reference to the drawings. In an example of the active matrix substrate described below, a gate driver is monolithically formed and a source driver is mounted.

Figure 1:
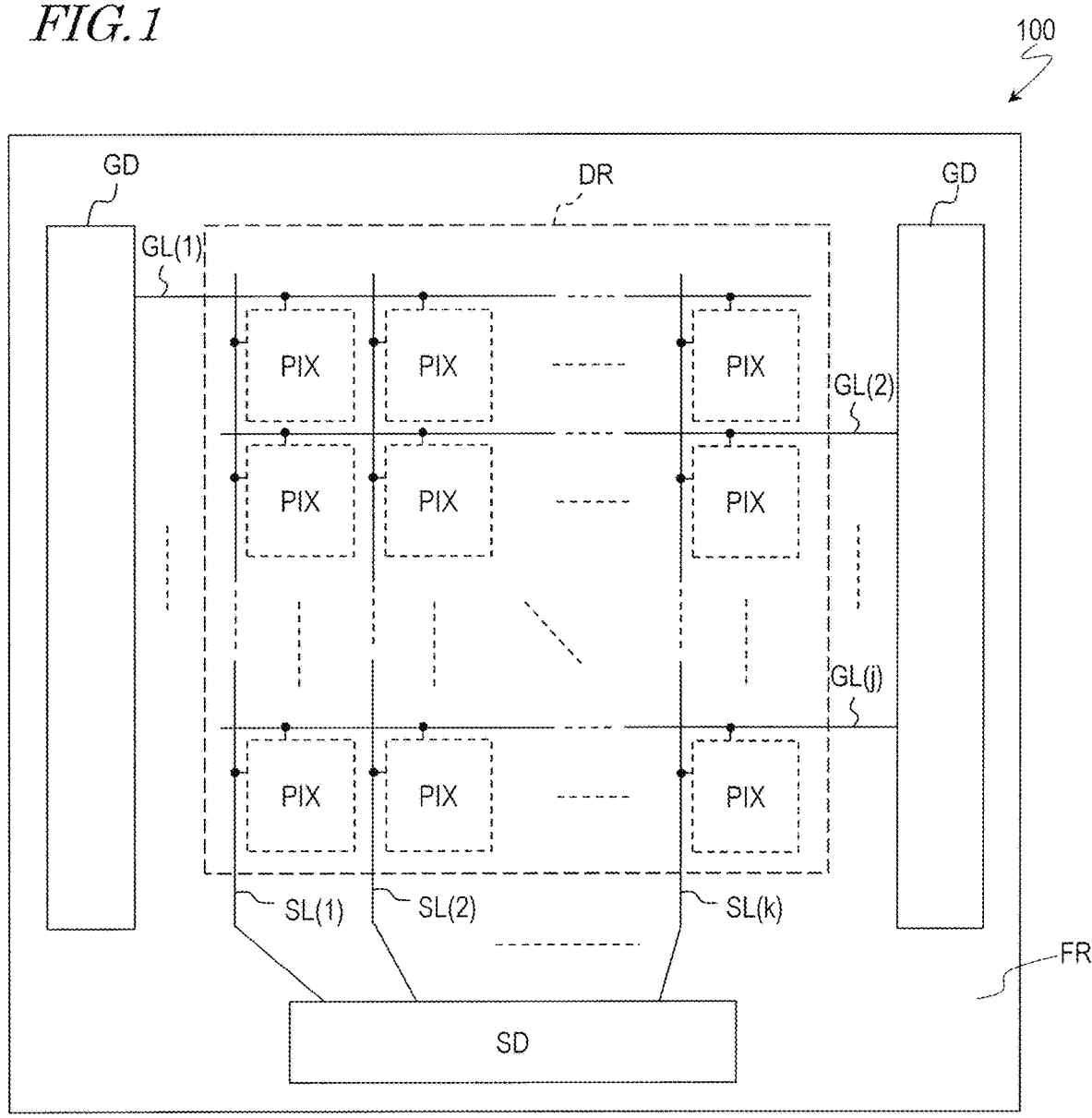
FIG. 1 is an overview showing an example of a planar configuration of an active matrix substrate 100 of an embodiment of the present invention.

First, the outline of the configuration of the active matrix substrate is described. FIG. 1 is an overview showing an example of a planar configuration of an active matrix substrate 100 of the present embodiment.

As shown in FIG. 1, the active matrix substrate 100 has a display region DR and a region FR exclusive of the display region DR (which is referred to as "non-display region" or "frame region"). The display region DR is defined by a plurality of pixel regions PIX arranged in a matrix. The pixel regions PIX are regions corresponding to the pixels of the display device. The pixel regions PIX are also simply referred to as "pixels". The non-display region FR is a region which lies around the display region DR and which does not contribute to displaying.

In the display region DR, a plurality of gate bus lines GL(1) to GL(j) (j is an integer not less than 2; hereinafter generically referred to as "gate bus lines GL") extending in the x direction (row direction) and a plurality of source bus lines SL(1) to SL(k) (k is an integer not less than 2; hereinafter generically referred to as "source bus lines SL") extending in the y direction (column direction) are provided. Each of the pixel regions PIX is, for example, a region enclosed by a pair of adjoining gate bus lines GL and a pair of adjoining source bus lines SL. The plurality of gate bus lines GL are connected with respective terminals of a gate driver GD. The plurality of source bus lines SL are connected with respective terminals of a source driver SD.

In the non-display region FR, peripheral circuits are provided. Specifically, in the non-display region FR, the gate driver GD for driving the gate bus lines GL is integrally (monolithically) formed, and the source driver SD for driving the source bus lines SL is mounted. In the non-display region FR, a Source Shared Driving (SSD) circuit for driving the source bus lines SL in a time division manner may be further provided.

Figure 2:
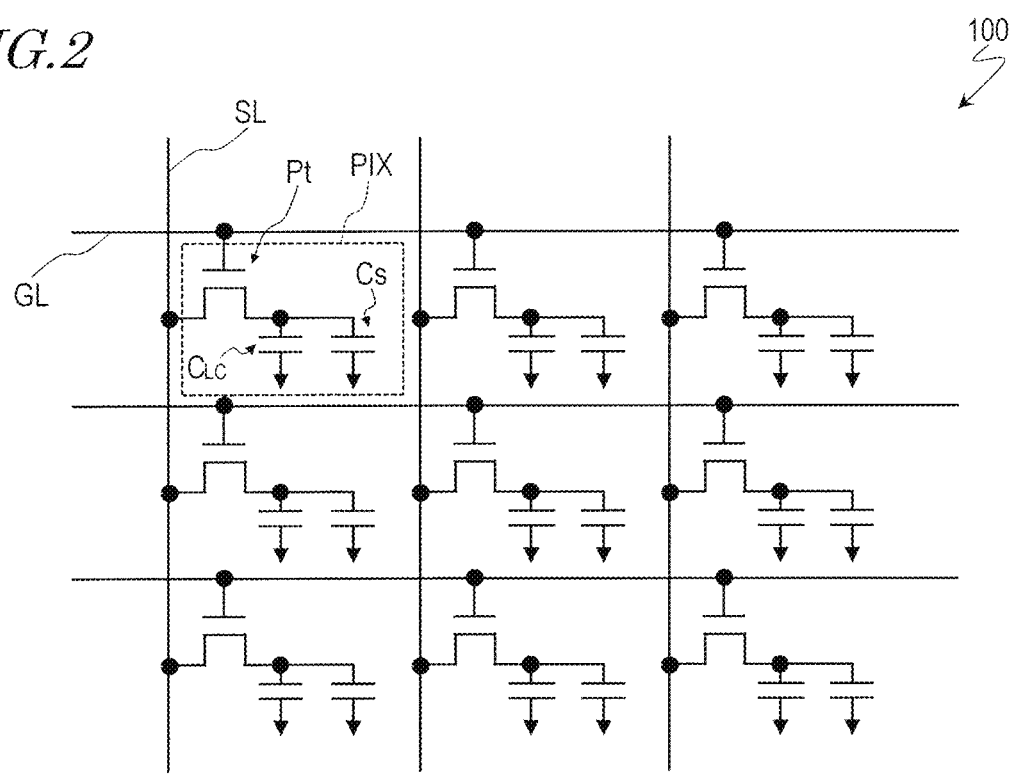
FIG. 2 is an equivalent circuit diagram of pixel regions PIX of the active matrix substrate 100.

FIG. 2 shows an equivalent circuit of each of the pixel regions PIX. Note that the liquid crystal capacitance $C_{LC}$ shown in FIG. 2 is provided for the sake of better understanding of the description although the liquid crystal capacitance $C_{LC}$ is to be formed in a liquid crystal display device which includes the active matrix substrate 100, but not to be formed in the active matrix substrate 100 only.

Each of the pixel regions PIX has a thin film transistor (pixel TFT) Pt, the liquid crystal capacitance $C_{LC}$, and the storage capacitance Cs. The pixel TFT Pt is supplied with a gate signal (scan signal) from a corresponding one of the gate bus lines GL and supplied with a source signal (display signal) from a corresponding one of the source bus lines SL. The liquid crystal capacitance $C_{LC}$ is formed by a pixel electrode electrically coupled with the drain electrode of the pixel TFT Pt, a common electrode provided so as to oppose the pixel electrode, and a liquid crystal layer interposed between the pixel electrode and the common electrode. The storage capacitance Cs is electrically coupled in parallel with the liquid crystal capacitance $C_{LC}$. When the active matrix substrate 100 is used in a liquid crystal display device of the transverse electric field mode such as FFS (Fringe Field Switching) mode, the common electrode is provided in the active matrix substrate 100. In contrast, when the active matrix substrate 100 is used in a liquid crystal display device of the vertical electric field mode, the common electrode is provided in a counter substrate which is provided so as to oppose the active matrix substrate 100 with the liquid crystal layer interposed therebetween.

The plurality of pixel regions PIX are scanned in a line sequential manner. When all of pixel TFTs Pt provided in one pixel row are changed to an ON state (selected) by gate signals supplied from the gate bus lines GL, display voltages corresponding to source signals supplied from the source bus lines SL are applied to the pixel electrodes via the pixel TFTs Pt. Meanwhile, in this case, the electric charge corresponding to the display voltage is accumulated in the storage capacitance Cs. After the charging for one pixel row is finished, the pixel TFTs Pt change to an OFF state, and the pixel TFTs Pt of the subsequent pixel row are selected. While the remaining pixel rows are sequentially scanned, the voltage applied to the pixel electrode is substantially maintained by the electric charge accumulated in the storage capacitance Cs.

Next, a more specific configuration of the active matrix substrate 100 is described with reference to FIG. 3(a) and FIG. 3(b). FIG. 3(a) and FIG. 3(b) are a plan view and a cross-sectional view schematically showing the active matrix substrate 100.

The active matrix substrate 100 includes a substrate 1 and a plurality of oxide semiconductor TFTs 10 supported on the substrate 1. FIG. 3(a) and FIG. 3(b) show a region corresponding to one of the oxide semiconductor TFTs 10.

The oxide semiconductor TFTs 10 includes a lower gate electrode 2, a gate insulating layer 3, an oxide semiconductor layer 4, a source electrode 5 and a drain electrode 6. The oxide semiconductor TFTs 10 further includes an insulating layer 7 and an upper gate electrode 8.

The lower gate electrode 2 is provided on the substrate 1. The gate insulating layer 3 covers the lower gate electrode 2.

The oxide semiconductor layer 4 is provided on the gate insulating layer 3 and overlaps the lower gate electrode 2 with the gate insulating layer 3 interposed therebetween. The oxide semiconductor layer 4 includes a channel region 4c and a source contact region 4s and a drain contact region 4d which are present on opposite sides of the channel region 4c.

The source electrode 5 is in contact with the source contact region 4s of the oxide semiconductor layer 4. The drain electrode 6 is in contact with the drain contact region 4d of the oxide semiconductor layer 4.

The insulating layer 7 covers the oxide semiconductor layer 4, the source electrode 5 and the drain electrode 6. The upper gate electrode 8 is provided on the insulating layer 7 and overlaps the oxide semiconductor layer 4 with the insulating layer 7 interposed therebetween.

As previously described, the oxide semiconductor TFTs 10 of the present embodiment have the lower gate electrode 2 and the upper gate electrode 8. That is, the oxide semiconductor TFTs 10 have a double gate configuration.

In the oxide semiconductor TFT 10, when viewed in the normal direction of the substrate 1, the upper gate electrode 8 does not overlap the source electrode 5. That is, when viewed in the normal direction of the substrate 1, an end of the upper gate electrode 8 on the source electrode 5 side and an end of the source electrode 5 on the upper gate electrode 8 side are spaced away from each other by a predetermined distance d1. Therefore, the oxide semiconductor layer 4 includes a region of1 neighboring the source contact region 4s, which overlaps the lower gate electrode 2 but does not overlap the upper gate electrode 8.

In the oxide semiconductor TFT 10, when viewed in the normal direction of the substrate 1, the drain electrode 6 does not overlap the lower gate electrode 2. That is, when viewed in the normal direction of the substrate 1, an end of the drain electrode 6 on the lower gate electrode 2 side and an end of the lower gate electrode 2 on the drain electrode 6 side are spaced away from each other by a predetermined distance d2. Therefore, the oxide semiconductor layer 4 includes a region of2 neighboring the drain contact region 4d, which overlaps the upper gate electrode 8 but does not overlap the lower gate electrode 2.

Figure 4:
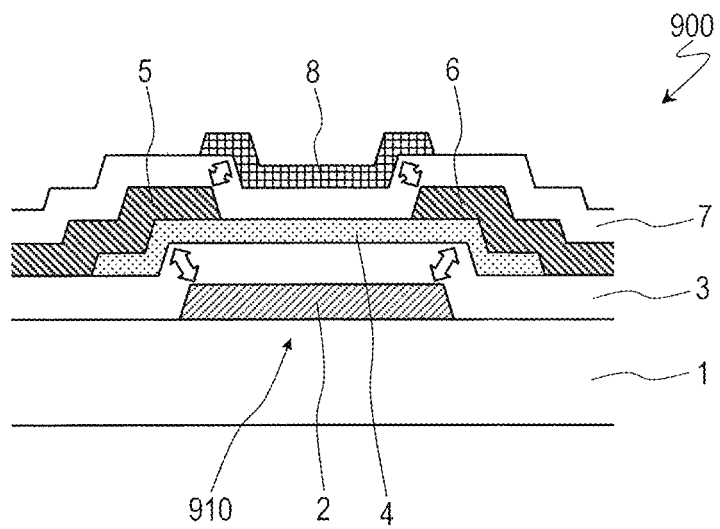
FIG. 4 is a cross-sectional view showing an active matrix substrate 900 of Comparative Example.

The oxide semiconductor TFTs 10 of the present embodiment has the above-described configuration and therefore can reduce the parasitic capacitance. Hereinafter, the reasons for this are described in more detail. FIG. 4 is a cross-sectional view showing an active matrix substrate 900 of Comparative Example.

The oxide semiconductor TFT 910 of the active matrix substrate 900 of Comparative Example has a double gate configuration which includes a lower gate electrode 2 and an upper gate electrode 8. The lower gate electrode 2 is provided under the oxide semiconductor layer 4. The upper gate electrode 8 is provided above the oxide semiconductor layer 4. Note that, however, the active matrix substrate 900 is different from the active matrix substrate 100 of the present embodiment in that when viewed in the normal direction of the substrate 1, the source electrode 5 overlaps both the lower gate electrode 2 and the upper gate electrode 8 and that the drain electrode 6 also overlaps both the lower gate electrode 2 and the upper gate electrode 8.

Thus, in the active matrix substrate 900 of Comparative Example, parasitic capacitance is formed between the source electrode 5 and the lower gate electrode 2 and between the source electrode 5 and the upper gate electrode 8, and parasitic capacitance is formed between the drain electrode 6 and the lower gate electrode 2 and between the drain electrode 6 and the upper gate electrode 8 (in FIG. 4, double-headed arrows represent that static capacitance of a nonegligible largeness is formed between the electrodes). Therefore, in the active matrix substrate 900 of Comparative Example, the parasitic capacitance is large.

Signals supplied to the gate bus lines GL and the source bus lines SL are rectangular waves, and necessary voltages need to be input to the pixel TFTs at necessary timings. In recent years, liquid crystal display devices have higher definition and larger display area and, accordingly, the ON time allocated to one pixel (horizontal scan period) decreases. Therefore, reducing as much as possible the signal delay which is attributed to the parasitic capacitance is preferred. However, in the active matrix substrate 900 of Comparative Example, the parasitic capacitance is large as previously described. Thus, when the oxide semiconductor TFT 910 is used as the pixel TFT, the gate signal delays (the signal waveform dulls) as shown in, for example, FIG. 5(a).

Figure 5:
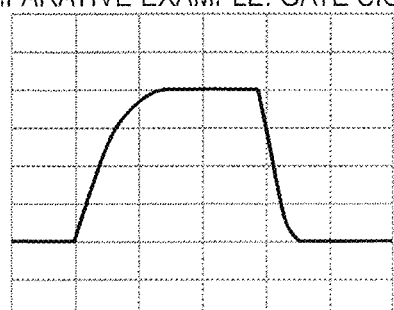
FIG. 5(a) is a graph showing the waveform of the gate signal in the active matrix substrate 900 of Comparative Example.
FIG. 5(b) is a graph showing the waveform of the gate signal in the active matrix substrate 100.
Figure 5:
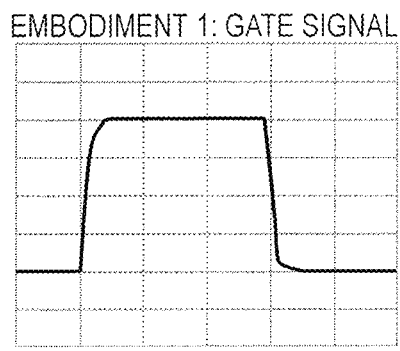

In contrast, in the active matrix substrate 100 of the present embodiment, when viewed in the normal direction of the substrate 1, the upper gate electrode 8 does not overlap the source electrode 5, and the drain electrode 6 does not overlap the lower gate electrode 2. Therefore, the parasitic capacitance (static capacitance) formed between the source electrode 5 and the upper gate electrode 8 and the parasitic capacitance (static capacitance) formed between the drain electrode 6 and the lower gate electrode 2 can be reduced. Thus, the signal delay (dulling of the signal waveform) can be suppressed. For example, as shown in FIG. 5(b), the delay of the gate signal can be suppressed.

The upper gate electrode 8 is preferably arranged such that the static capacitance formed between the upper gate electrode 8 and the source electrode 5 is not more than 80% of the static capacitance formed between the upper gate electrode 8 and the drain electrode 6. The drain electrode 6 is preferably arranged such that the static capacitance formed between the drain electrode 6 and the lower gate electrode 2 is not more than 80% of the static capacitance formed between the source electrode 5 and the lower gate electrode 2.

From the viewpoint of sufficiently reducing the static capacitance between the upper gate electrode 8 and the source electrode 5, it is preferred that when viewed in the normal direction of the substrate 1, an end of the upper gate electrode 8 on the source electrode 5 side and an end of the source electrode 5 on the upper gate electrode 8 side are spaced away from each other by 2 µm or more (i.e., the width d1 of the region of1 is not less than 2 µm).

From the viewpoint of sufficiently reducing the static capacitance between the drain electrode 6 and the lower gate electrode 2, it is preferred that when viewed in the normal direction of the substrate 1, an end of the drain electrode 6 on the lower gate electrode 2 side and an end of the lower gate electrode 2 on the drain electrode 6 side are spaced away from each other by 2 µm or more (i.e., the width d2 of the region of2 is 2 µm or more).

The edge of the source electrode 5 and the edge of the lower gate electrode 2 may be generally in agreement with each other (i.e., the source electrode 5 and the lower gate electrode 2 hardly overlap each other), or the source electrode 5 may overlap the lower gate electrode 2. From the viewpoint of reducing the parasitic capacitance, it is preferred that the width of the overlap between the source electrode 5 and the lower gate electrode 2 is as small as possible.

Figure 6:
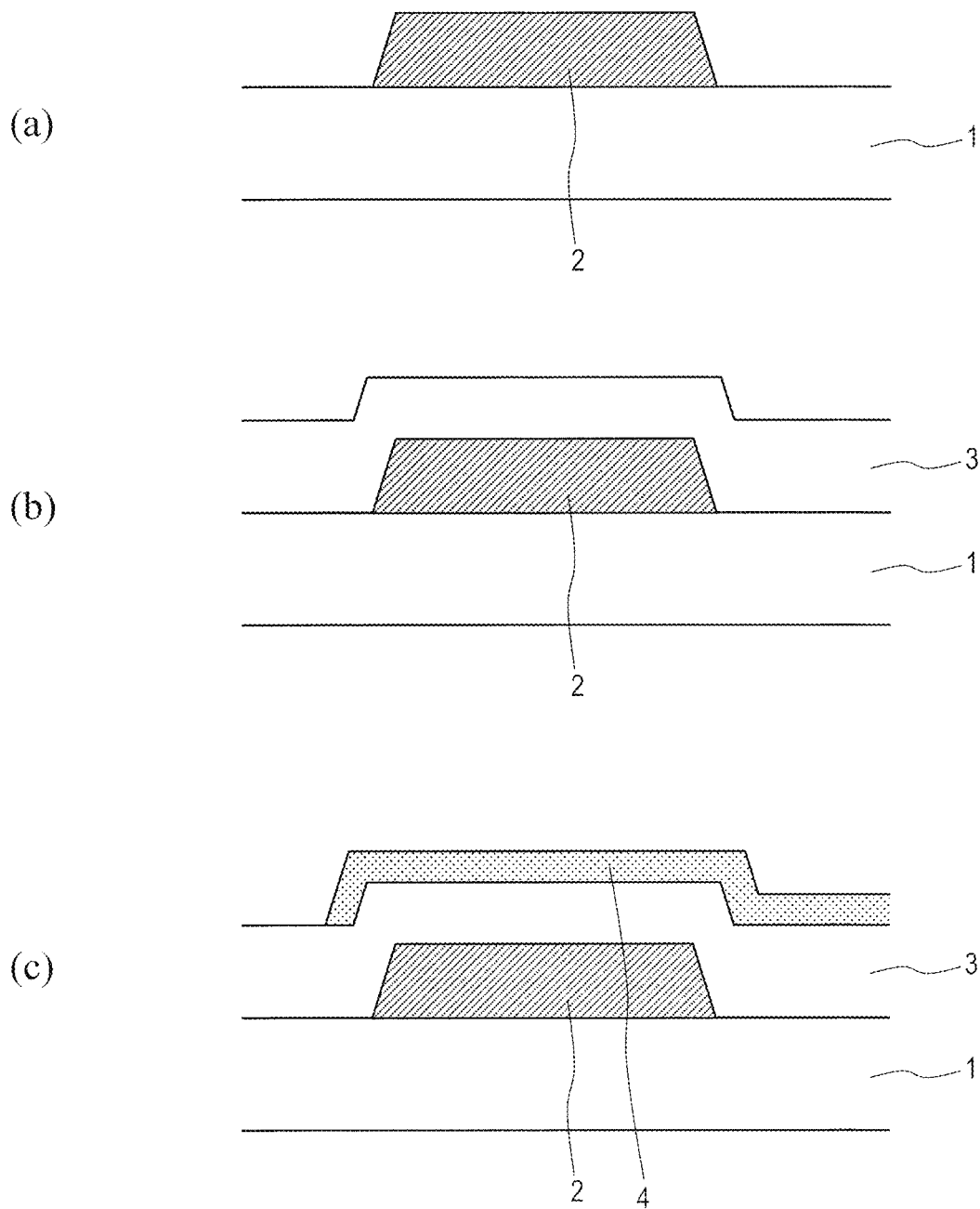
FIG. 6(a), FIG. 6(b) and FIG. 6(c) are stepwise cross-sectional views showing the manufacturing process of the active matrix substrate 100.
Figure 7:
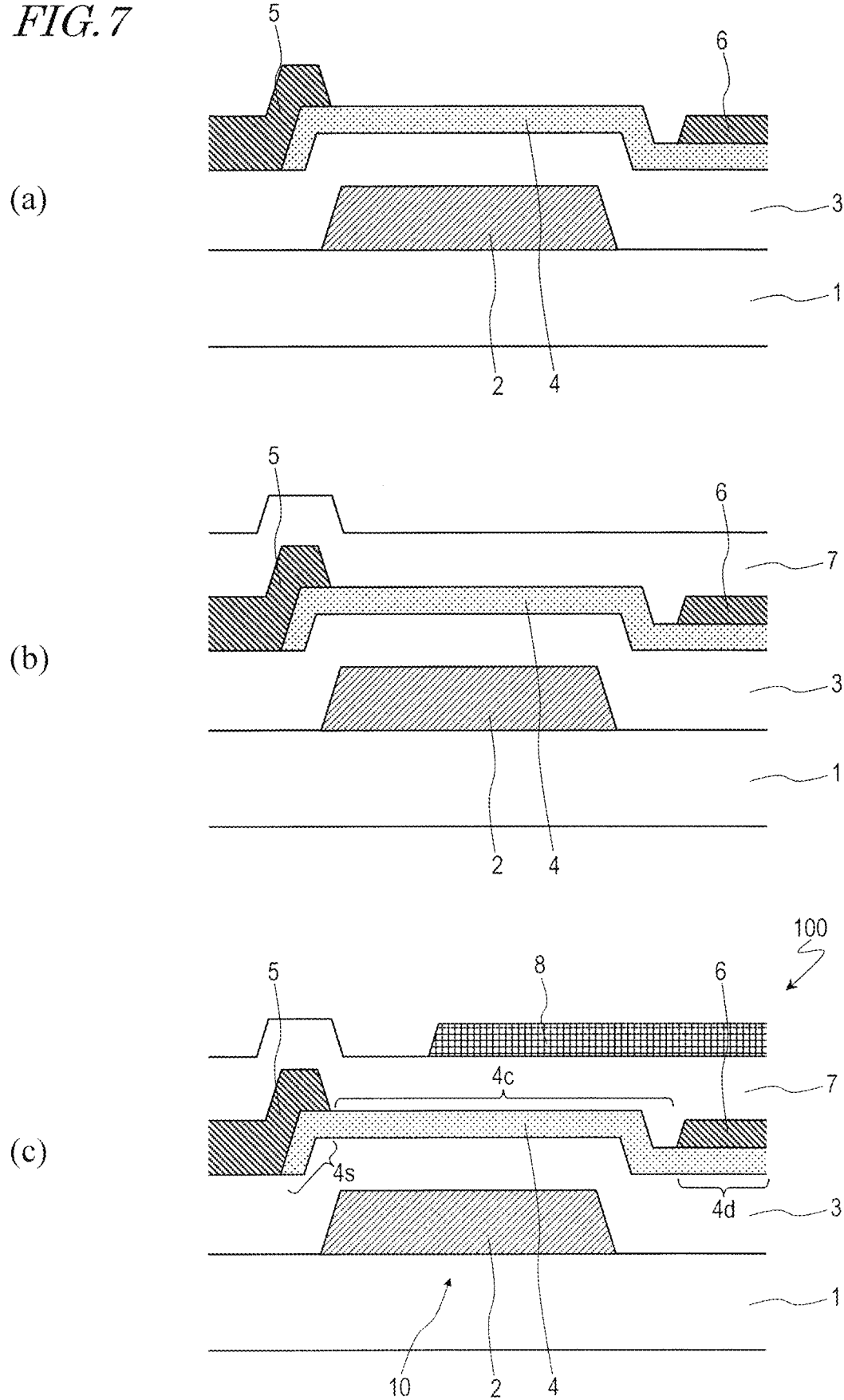
FIG. 7(a), FIG. 7(b) and FIG. 7(c) are stepwise cross-sectional views showing the manufacturing process of the active matrix substrate 100.

A manufacturing method of the active matrix substrate 100 of the present embodiment is described with reference to FIG. 6 and FIG. 7. FIG. 6(a), FIG. 6(b) and FIG. 6(c) and FIG. 7(a), FIG. 7(b) and FIG. 7(c) are stepwise cross-sectional views showing the manufacturing process of the active matrix substrate 100.

First, as shown in FIG. 6(a), a lower gate electrode 2 is formed on a substrate 1. For example, an electrically-conductive film is deposited by sputtering and thereafter patterned through a photolithography process, whereby the lower gate electrode 2 can be formed.

As the substrate 1, for example, a glass substrate, a silicon substrate, a heat-resistant plastic substrate (resin substrate), or the like, can be used. As the electrically-conductive film (gate metal film) for formation of the lower gate electrode 2, a film which contains a metal such as aluminum (Al), tungsten (W), molybdenum (Mo), tantalum (Ta), chromium (Cr), titanium (Ti), copper (Cu), gold (Au), or an alloy thereof, or a metal nitride thereof, can be appropriately used. Alternatively, a multilayer film which includes a plurality of such films may be used. Herein, as the gate metal film, a film including a Ti film, an Al film and a Ti film in this order is used. The thickness of the lower gate electrode 2 is, for example, not less than 100 nm and not more than 500 nm.

Then, as shown in FIG. 6(b), a gate insulating layer 3 is formed so as to cover the lower gate electrode 2. For example, the gate insulating layer 3 can be formed by CVD. As the gate insulating layer 3, a silicon oxide ($SiO_2$) layer, a silicon nitride ($SiNx$) layer, a silicon oxynitride ($SiOxNy$; x>y) layer, a silicon nitroxide ($SiNxOy$; x>y) layer, or the like, can be appropriately used. The gate insulating layer 3 may have a multilayer structure. For example, a SiNx layer may be formed as the lower layer on the substrate 1 side for preventing diffusion of impurities from the substrate 1, and a $SiO_2$ layer may be formed on the SiNx layer as the upper layer for ensuring insulation. The thickness of the gate insulating layer 2 is, for example, not less than 150 nm and not more than 400 nm.

Then, as shown in FIG. 6(c), an oxide semiconductor layer 4 is formed on the gate insulating layer 3. For example, an oxide semiconductor film is deposited by sputtering and thereafter patterned through a photolithography process, whereby the oxide semiconductor layer 4 in the shape of an island can be formed. The oxide semiconductor layer 4 is formed so as to overlap the lower gate electrode 2 with the gate insulating layer 3 interposed therebetween. Herein, as the oxide semiconductor layer 4, an In—Ga—Zn—O based semiconductor layer is formed which has the composition ratio of In:Ga:Zn=1:1:1. The thickness of the oxide semiconductor layer 4 is, for example, not less than 10 nm and not more than 200 nm.

Then, as shown in FIG. 7(a), a source electrode 5 and a drain electrode 6 are formed on the gate insulating layer 3 and the oxide semiconductor layer 4. For example, an electrically-conductive film is deposited by sputtering and thereafter patterned through a photolithography process, whereby the source electrode 5 and the drain electrode 6 can be formed. As the electrically-conductive film (source metal film) for formation of the source electrode 5 and the drain electrode 6, a film which contains a metal such as aluminum (Al), tungsten (W), molybdenum (Mo), tantalum (Ta), copper (Cu), chromium (Cr), titanium (Ti), gold (Au), or an alloy thereof, or a metal nitride thereof, can be appropriately used. Alternatively, a multilayer film which includes a plurality of such films may be used. Herein, as the source metal film, a film including a Ti film (or a Mo film), an Al film and a Ti film (or a Mo film) in this order is used. The thickness of the source electrode 5 and the drain electrode 6 is, for example, not less than 100 nm and not more than 500 nm.

Then, as shown in FIG. 7(b), an insulating layer (passivation layer) 7 is formed so as to cover the oxide semiconductor layer 4, the source electrode 5 and the drain electrode 6. For example, the insulating layer 7 can be formed by CVD. As the insulating layer 7, a silicon oxide ($SiO_2$) layer, a silicon nitride (SiNx) layer, a silicon oxynitride (SiOxNy; x>y) layer, a silicon nitroxide (SiNxOy; x>y) layer, or the like, can be appropriately used. The insulating layer 7 may have a multilayer structure. For example, a $SiO_2$ layer may be formed as the lower layer on the substrate 1 side, and a SiNx layer may be formed as the upper layer on the $SiO_2$ layer. When a layer containing oxygen (e.g., oxide layer such as $SiO_2$) is used for the lower layer that is in contact with the oxide semiconductor layer 4, excessive oxygen deficiencies in the oxide semiconductor layer 4 which are attributed to entry of external moisture or impurities can be covered by oxygen contained in the oxide layer. The thickness of the insulating layer 7 is, for example, not less than 100 nm and not more than 500 nm.

Then, as shown in FIG. 7(c), an upper gate electrode 8 is formed on the insulating layer 7. For example, an electrically-conductive film is deposited by sputtering and thereafter patterned through a photolithography process, whereby the upper gate electrode 8 can be formed. Herein, as the electrically-conductive film for formation of the upper gate electrode 8, an IZO film is used, but the present invention is not limited to this example. For example, an ITO film may be used. Alternatively, a film which contains a metal such as aluminum (Al), tungsten (W), molybdenum (Mo), tantalum (Ta), chromium (Cr), titanium (Ti), copper (Cu), gold (Au), or an alloy thereof, or a metal nitride thereof, may be used. The thickness of the upper gate electrode 8 is, for example, not less than 10 nm and not more than 400 nm.

In this way, the active matrix substrate 100 which includes the oxide semiconductor TFTs 10 can be manufactured.

Figure 8:
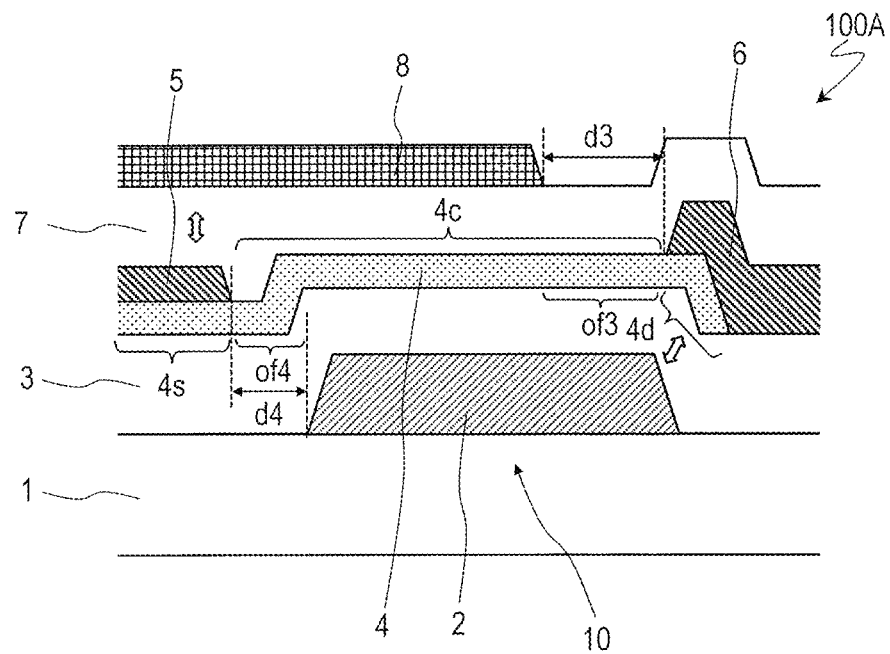
FIG. 8 is a cross-sectional view schematically showing an active matrix substrate 100A of an embodiment of the present invention.

FIG. 8 shows an alternative active matrix substrate 100A of the present embodiment. In the active matrix substrate 100A shown in FIG. 8, when viewed in the normal direction of the substrate 1, the upper gate electrode 8 of the oxide semiconductor TFTs 10 does not overlap the drain electrode 6. That is, when viewed in the normal direction of the substrate 1, an end of the upper gate electrode 8 on the drain electrode 6 side and an end of the drain electrode 6 on the upper gate electrode 8 side are spaced away from each other by a predetermined distance d3. Therefore, the oxide semiconductor layer 4 includes a region of3 neighboring the drain contact region 4d, which overlaps the lower gate electrode 2 but does not overlap the upper gate electrode 8.

When viewed in the normal direction of the substrate 1, the source electrode 5 does not overlap the lower gate electrode 2. That is, when viewed in the normal direction of the substrate 1, an end of the source electrode 5 on the lower gate electrode 2 side and an end of the lower gate electrode 2 on the source electrode 5 side are spaced away from each other by a predetermined distance d4. Therefore, the oxide semiconductor layer 4 includes a region of4 neighboring the source contact region 4s, which overlaps the upper gate electrode 8 but does not overlap the lower gate electrode 2.

Figure 3:
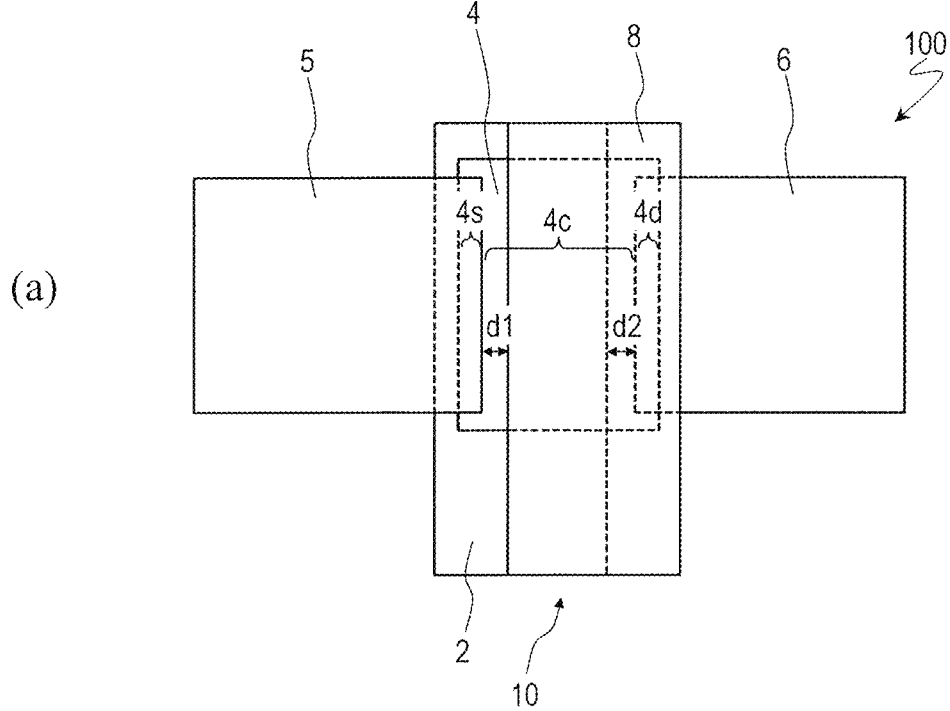
FIG. 3(a) and FIG. 3(b) are a plan view and a cross-sectional view schematically showing the active matrix substrate 100.
Figure 3:
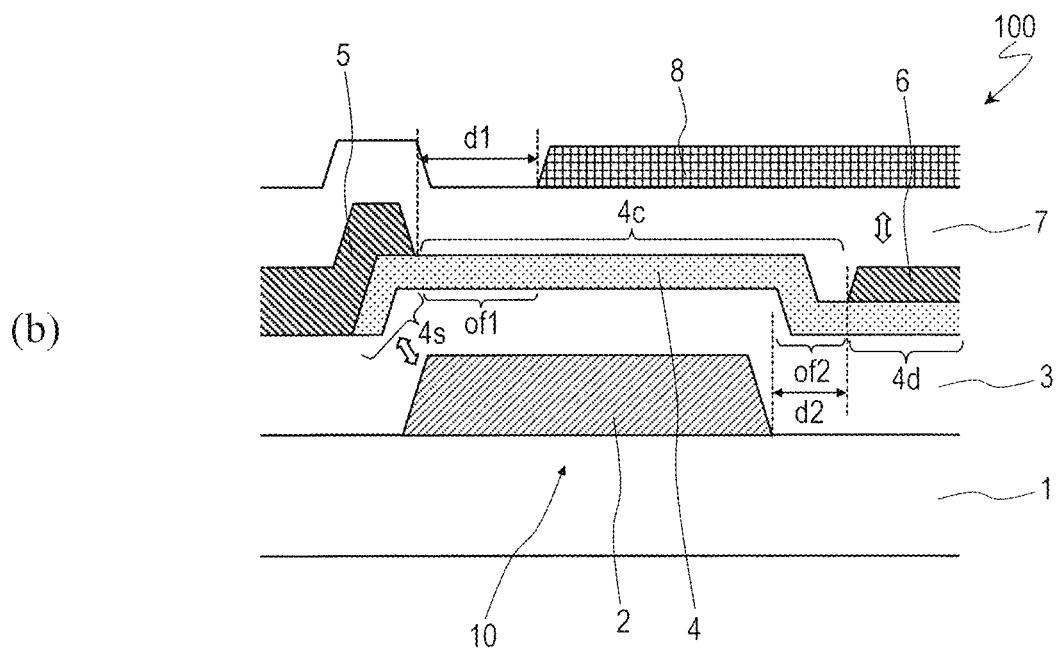

Thus, the oxide semiconductor TFTs 10 of the active matrix substrate 100A have such a configuration that the source side and the drain side of the oxide semiconductor TFTs 10 of the active matrix substrate 100 shown in FIG. 3 are reversed with each other.

In the active matrix substrate 100A, the parasitic capacitance (static capacitance) formed between the drain electrode 6 and the upper gate electrode 8 and the parasitic capacitance (static capacitance) formed between the source electrode 5 and the lower gate electrode 2 can be reduced. Thus, the signal delay (dulling of the signal waveform) can be suppressed.

The upper gate electrode 8 is preferably arranged such that the static capacitance formed between the upper gate electrode 8 and the drain electrode 6 is not more than 80% of the static capacitance formed between the upper gate electrode 8 and the source electrode 5. The source electrode 5 is preferably arranged such that the static capacitance formed between the source electrode 5 and the lower gate electrode 2 is not more than 80% of the static capacitance formed between the drain electrode 6 and the lower gate electrode 2.

From the viewpoint of sufficiently reducing the static capacitance between the upper gate electrode 8 and the drain electrode 6, it is preferred that when viewed in the normal direction of the substrate 1, an end of the upper gate electrode 8 on the drain electrode 6 side and an end of the drain electrode 6 on the upper gate electrode 8 side are spaced away from each other by 2 μm or more (i.e., the width d3 of the region of3 is 2 μm or more).

From the viewpoint of sufficiently reducing the static capacitance between the source electrode 5 and the lower gate electrode 2, it is preferred that when viewed in the normal direction of the substrate 1, an end of the source electrode 5 on the lower gate electrode 2 side and an end of the lower gate electrode 2 on the source electrode 5 side are spaced away from each other by 2 μm or more (i.e., the width d4 of the region of4 is 2 μm or more).

Figure 9:
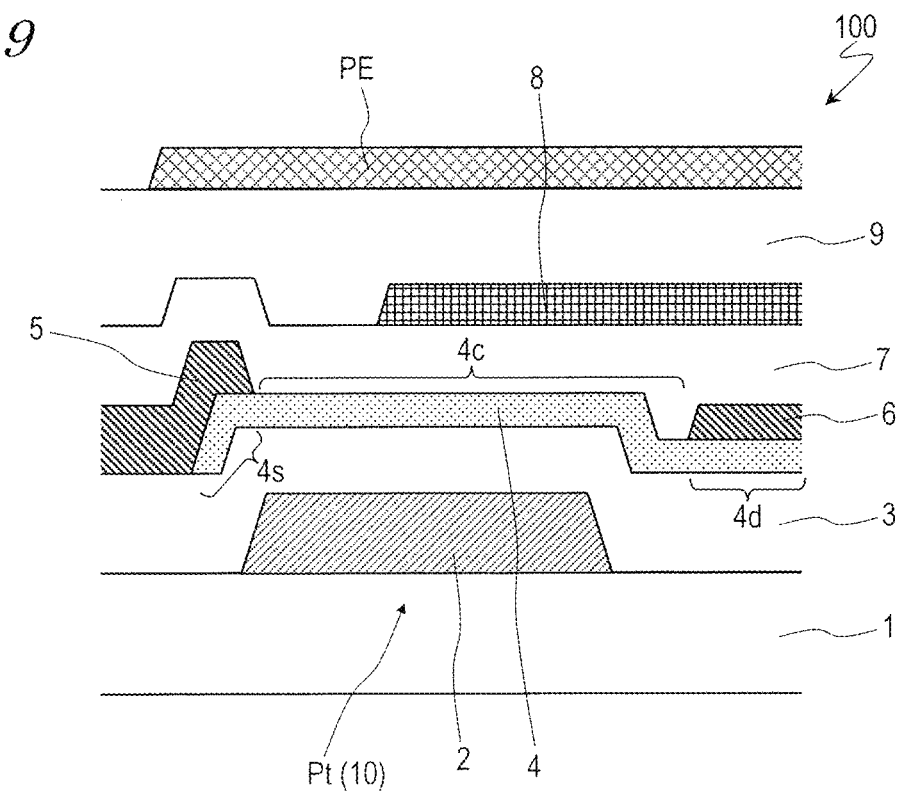
FIG. 9 is a diagram showing an example of the cross-sectional configuration in a case where an oxide semiconductor TFT 10 is a pixel TFT.

The oxide semiconductor TFTs 10 of the active matrix substrates 100 and 100A of the present embodiment can be suitably used as the pixel TFTs Pt. FIG. 9 shows an example of the cross-sectional configuration in a case where the oxide semiconductor TFT 10 of the active matrix substrate 100 is used as the pixel TFT.

As shown in FIG. 9, an organic insulating layer (planarization layer) 9 is provided so as to cover the pixel TFT Pt (oxide semiconductor TFT 10), and a pixel electrode PE is provided on the organic insulating layer 9. The pixel electrode PE is electrically coupled with the drain electrode of the pixel TFT Pt in an unshown contact hole. The organic insulating layer 9 is made of, for example, a photosensitive resin material. The pixel electrode PE is made of a transparent electrically-conductive material (e.g., IZO or ITO). As previously described, the upper gate electrode 8 may be made of a transparent electrically-conductive material or may be made of a metal material.

The oxide semiconductor TFTs 10 of the active matrix substrates 100 and 100A of the present embodiment may be used as circuit TFTs (TFTs which are constituents of peripheral circuits).

Embodiment 2

Figure 10:
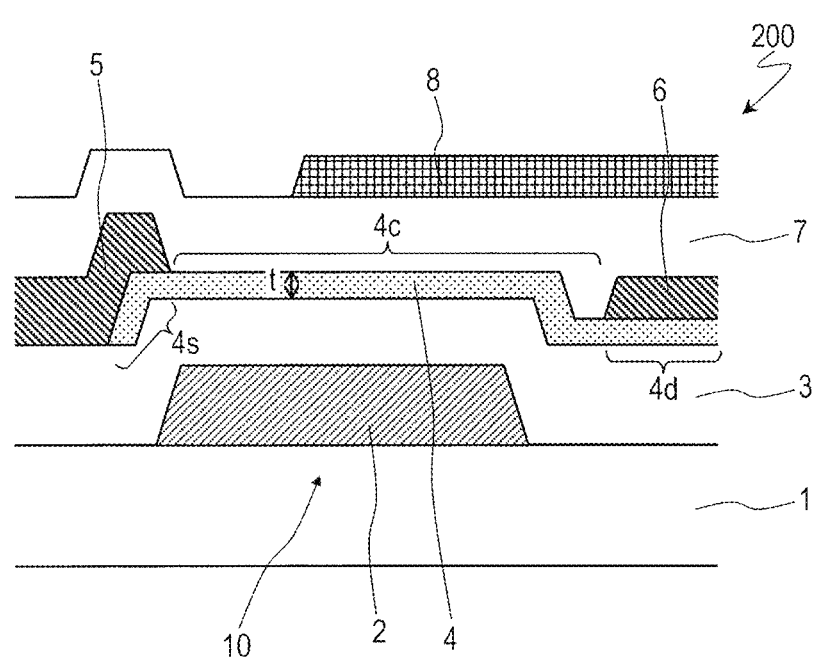
FIG. 10 is a cross-sectional view schematically showing an active matrix substrate 200 of an embodiment of the present invention.

An active matrix substrate 200 of the present embodiment is described with reference to FIG. 10. FIG. 10 is a cross-sectional view schematically showing the active matrix substrate 200. Hereinafter, the differences of the active matrix substrate 200 from the active matrix substrate 100 shown in FIG. 3 are mainly described.

In the active matrix substrate 200, the thickness t of the oxide semiconductor layer 4 of the oxide semiconductor TFTs 10 is not more than a predetermined value. Specifically, the thickness t of the oxide semiconductor layer 4 is not more than 10 μm.

Since the thickness t of the oxide semiconductor layer 4 is sufficiently small (not more than 10 μm as in the present embodiment), the effect of improving the TFT characteristics which is attributed to the double gate configuration can be more surely achieved. Hereinafter, the reasons for this will be described with reference to FIG. 11(a) and FIG. 11(b).

Figure 11:
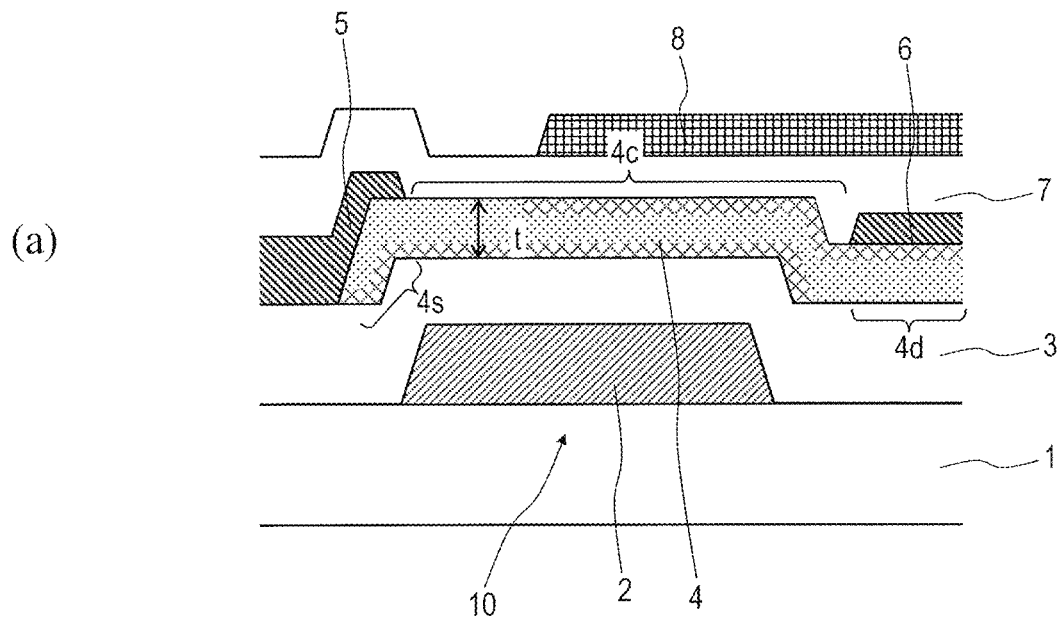
FIG. 11(a) and FIG. 11(b) are diagrams for illustrating effects which are attributed to the circumstance that the thickness t of an oxide semiconductor layer 4 is small.
Figure 11:
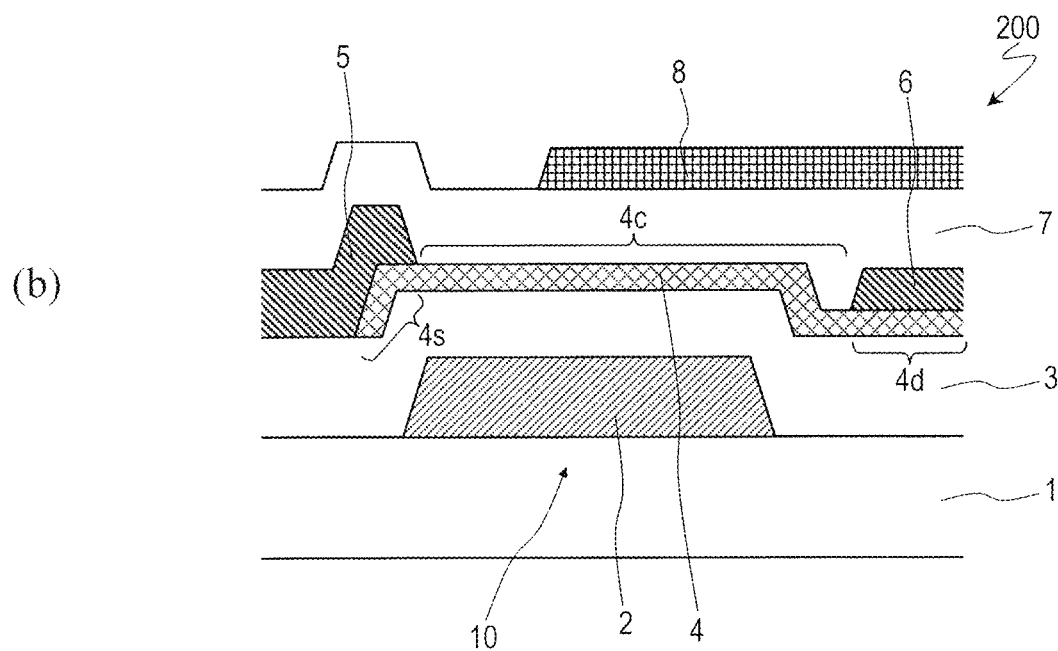

When the thickness t of the oxide semiconductor layer 4 is large, in some cases, as schematically shown in FIG. 11(a), part of the oxide semiconductor layer 4 which actually functions as the channel region 4c (in the drawing, cross-hatched part) is as if being separated into two layers so that a desired characteristics improving effect cannot be achieved.

On the other hand, when the thickness t of the oxide semiconductor layer 4 is sufficiently small, as schematically shown in FIG. 11(b), part of the oxide semiconductor layer 4 which actually functions as the channel region 4c would not be separated into two layers (i.e., a region excited by the lower gate electrode 2 and a region excited by the upper gate electrode 8 are realized by a common region) so that a desired characteristics improving effect can be more surely achieved.

Embodiment 3

For devices of which narrowing of the frame has been highly demanded, such as smartphones, monolithically forming a demultiplexer circuit such as source shared driving (SSD) circuit in addition to the gate driver has been proposed. The SSD circuit is a circuit for distributing video data, which is supplied via a single video signal line from each terminal of the source driver, to a plurality of source bus lines. Incorporation of the SSD circuit enables further narrowing of a part of the non-display region in which terminals and wires are provided (terminal and wire formation region). Further, the number of outputs from the source driver is reduced, and accordingly, the circuit size can be reduced. Therefore, the cost of the driver IC can be reduced.

In this specification, some of the circuit TFTs which are constituents of a driver circuit are referred to as "driver circuit TFTs", and some others of the circuit TFTs which are used as switching elements in a demultiplexer circuit (SSD circuit) are referred to as "DMX circuit TFTs".

If the DMX circuit TFTs are formed in the active matrix substrate using an identical oxide semiconductor film with that of the pixel TFTs and the driver circuit TFTs, the following problems will arise.

The characteristics required of the DMX circuit TFTs are different from those required of the driver circuit TFTs, and it is difficult to simultaneously achieve both of these characteristics. For example, driver circuit TFTs used for the gate driver are, usually, enhancement mode TFTs whose threshold voltage Vth is positive for the purpose of preventing circuit operation failures. However, in the enhancement mode TFTs, it is difficult to further increase the ON current, and there is a probability that the enhancement mode TFTs cannot be suitably applied to the DMX circuit TFTs.

According to the present embodiment, a plurality of oxide semiconductor TFTs which have different characteristics can be respectively formed on the same substrate. Further, for example, the carrier density of the oxide semiconductor layer of the DMX circuit TFTs can be higher than the carrier density of the oxide semiconductor layer of the other TFTs, including pixel TFTs and driver circuit TFTs. As a result, the threshold voltage of DMX circuit TFTs can be further decreased while the TFT characteristics of the pixel TFTs and the driver circuit TFTs are maintained. Therefore, the ON current of the DMX circuit TFTs can be increased. Thus, both the characteristics required of the DMX circuit TFTs and the characteristics required of the driver circuit TFTs or the pixel TFTs can be easily, simultaneously achieved.

In the active matrix substrate of the present embodiment, a plurality of first TFTs and a plurality of second TFTs are formed using an identical oxide semiconductor film. The first TFTs and the second TFTs have different characteristics. For example, the threshold voltage of the first TFTs may be higher than the threshold voltage of the second TFTs. The first TFTs includes, for example, DMX circuit TFTs which are constituents of the demultiplexer circuit. The second TFTs includes, for example, pixel TFTs or driver circuit TFTs which are constituents of the gate driver GD. The second TFTs may include both driver circuit TFTs and pixel TFTs.

Figure 12:
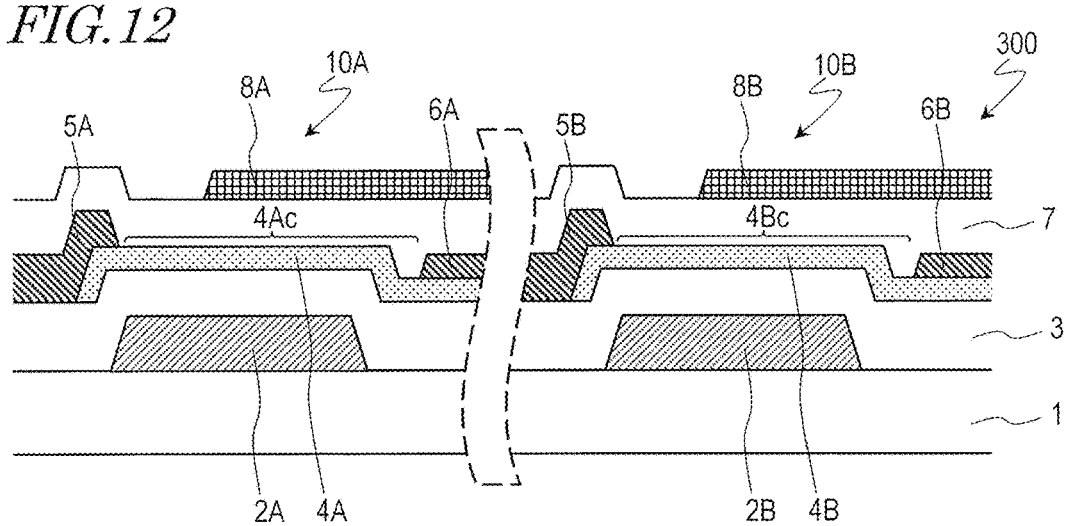
FIG. 12 is a cross-sectional view schematically showing an active matrix substrate 300 of an embodiment of the present invention.

An active matrix substrate 300 of the present embodiment is described with reference to FIG. 12. FIG. 12 is a cross-sectional view illustrating a first TFT 10A and a second TFT 10B included in the active matrix substrate 300. Herein, the first TFT 10A is a DMX circuit TFT, and the second TFT 10B is a driver circuit TFT. The first TFT 10A and the second TFT 10B are oxide semiconductor TFTs of the bottom gate configuration which have active layers formed by the same oxide semiconductor film.

The first TFT 10A includes a lower gate electrode 2A, a gate insulating layer 3, an oxide semiconductor layer 4A, a source electrode 5A, a drain electrode 6A, an insulating layer 7 and an upper gate electrode 8A. The oxide semiconductor layer 4A includes a channel region 4Ac. Likewise, the second TFT 10B includes a lower gate electrode 2B, a gate insulating layer 3, an oxide semiconductor layer 4B, a source electrode 5B, a drain electrode 6B, an insulating layer 7 and an upper gate electrode 8B. The oxide semiconductor layer 4B includes a channel region 4Bc. The planar shape, size, channel length L, channel width, etc., of the respective layers may be different between the first TFT 10A and the second TFT 10B.

The oxide semiconductor layers 4A and 4B of the first TFT 10A and the second TFT 10B are formed by an identical oxide semiconductor film. The oxide semiconductor layers 4A and 4B may have the same composition ratio (when the oxide semiconductor film is an In—Ga—Zn—O based semiconductor film, In:Ga:Zn:O). Also, the oxide semiconductor layers 4A and 4B may have substantially equal thicknesses. "Having substantially equal thicknesses" means that the process of decreasing (or increasing) the film thickness has not been performed on part of the oxide semiconductor film. For example, the oxide semiconductor layers 4A and 4B may have different thicknesses due to a film thickness distribution which is brought about by the film formation process.

The upper gate electrode 8A of the first TFT 10A does not overlap the source electrode 5A, and the drain electrode 6A of the first TFT 10A does not overlap the lower gate electrode 2A. Likewise, the upper gate electrode 8B of the second TFT 10B does not overlap the source electrode 5B, and the drain electrode 6B of the second TFT 10B does not overlap the lower gate electrode 2B. Thus, also in the active matrix substrate 300 of the present embodiment, the parasitic capacitance can be reduced as in the active matrix substrate 100 of Embodiment 1.

In the present embodiment, the carrier density Ca in the channel region 4Ac of the oxide semiconductor layer 4A of the first TFT 10A (hereinafter, "first carrier density") is higher than the carrier density Cb in the channel region 4Bc of the oxide semiconductor layer 4B of the second TFT 10B (hereinafter, "second carrier density") (Ca>Cb). Such a configuration can be achieved by, for example, supplying a reducing gas, such as hydrogen, argon, or the like, to the channel region 4Ac of the first TFT 10A. When hydrogen is supplied to an oxide semiconductor, oxygen deficiencies are produced in the oxide semiconductor through a reduction reaction of the oxide semiconductor, and carrier electrons are generated. As a result, the carrier density increases. Specific methods of making the oxide semiconductor layer 4A and the oxide semiconductor layer 4B have different carrier densities will be described later.

By making the first carrier density Ca of the channel region 4Ac of the first TFT 10A higher than the second carrier density Cb of the channel region 4Bc of the second TFT 10B, the threshold voltage Vth(a) of the first TFT 10A (hereinafter, "first threshold voltage") is lower than the threshold voltage Vth(b) of the second TFT 10B (hereinafter, "second threshold voltage") (Vth(a)<Vth(b)). Thus, by making the first TFT 10A and the second TFT 10B have different characteristics, TFTs which can be suitably applied to the SSD circuit and TFTs which can be suitably applied to the driver circuit and the pixels can be respectively formed.

The first carrier density Ca and the second carrier density Cb can be measured using, for example, a Hall effect sensor. More specifically, Hall effect sensors are produced which include oxide semiconductor layers formed through the same processes as the oxide semiconductor layers 4A, 4B included in the first TFT 10A and the second TFT 10B, and the carrier density of the oxide semiconductor layer can be determined based on the characteristics of the produced Hall effect sensors. Further, by determining the relationship between the characteristics of a TFT which includes the oxide semiconductor layer 4A, 4B (for example, threshold voltage (Vth), ON current) and the carrier density determined based on a corresponding one of the above-described Hall effect sensors, the relationship between the carrier density and the TFT characteristics will be known.

The first TFT 10A may be a depletion mode TFT, and the second TFT 10B may be an enhancement mode TFT. In this case, the ON current of the first TFT 10A which is used as a DMX circuit TFT can be further improved. When the second TFT 10B is used as a driver circuit TFT, occurrence of circuit operation failures can be suppressed and, therefore, the decrease of the yield can be suppressed.

According to the present embodiment, DMX circuit TFTs can be formed using the same oxide semiconductor film as that used in the pixel TFTs or the driver circuit TFTs such that the threshold voltage Vth of the DMX circuit TFTs is lower than that of the pixel TFTs or the driver circuit TFTs, i.e., the ON current of the DMX circuit TFTs is higher than that of the pixel TFTs or the driver circuit TFTs.

<Method of Forming First TFT 10A and Second TFT 10B>

FIG. 13(a) and FIG. 13(b) and FIG. 14(a) and FIG. 14(b) are stepwise cross-sectional views for illustrating an example of the method of forming the first TFT 10A and the second TFT 10B on the substrate 1. These drawings show a region R1 of the substrate 1 in which the first TFT 10A is to be formed (hereinafter "first region") and a region R2 of the substrate 1 in which the second TFT 10B is to be formed (hereinafter "second region").

Figure 13:
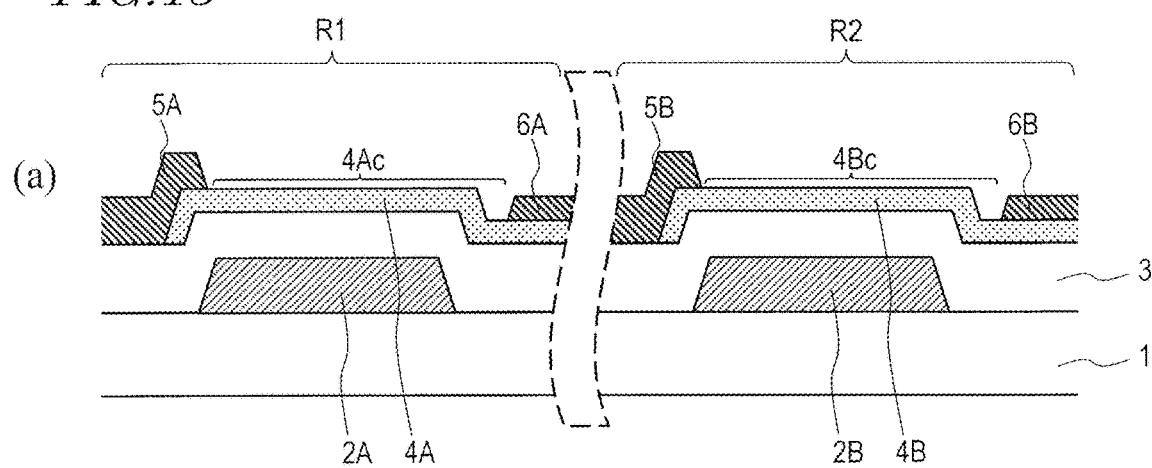
FIG. 13(a) and FIG. 13(b) are stepwise cross-sectional views for illustrating the method of forming the first TFT 10A and the second TFT 10B of the active matrix substrate 300.
Figure 13:
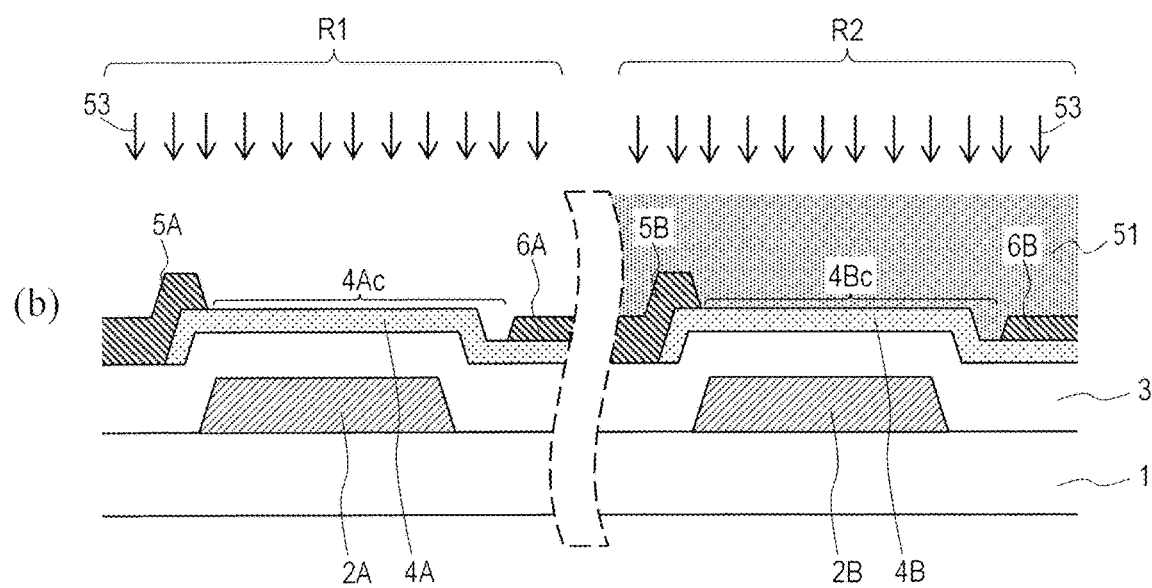

First, as shown in FIG. 13(a), lower gate electrodes 2A, 2B, a gate insulating layer 3, oxide semiconductor layers 4A, 4B, source electrodes 5A, 5B and drain electrodes 6A, 6B are sequentially formed on a substrate 1. These steps can be carried out in the same way as the process shown in FIG. 6(a) to FIG. 7(a).

Then, as shown in FIG. 13(b), a mask (resist layer) 51 is formed so as to cover the second region R2 and to have an opening above the first region R1. The mask 51 may have such a shape that the mask 51 covers the channel region 4Bc of the oxide semiconductor layer 4B formed in the second region R2 and that the channel region 4Ac of the oxide semiconductor layer 4A formed in the first region R1 is exposed.

The resultant structure is subjected to a plasma treatment from above the mask 51. Herein, plasma 53 is applied using a reducing gas (e.g., noble gas such as hydrogen gas, argon gas, etc.) in a plasma CVD apparatus. The plasma 53 is applied to the oxide semiconductor layer 4A. As a result, oxygen deficiencies are produced, and carrier electrons are generated, so that the carrier density Ca (first carrier density) of the channel region 4Ac can increase. Meanwhile, the oxide semiconductor layer 4B is protected with the mask 51 and is therefore not exposed to the plasma, so that the carrier density Cb (second carrier density) is maintained. Thus, the first carrier density Ca can be higher than the second carrier density Cb.

The second carrier density Cb of the channel region 4Bc of the second TFT 10B may be, for example, not less than $1\times10^{10}/cm^3$ and not more than $1\times10^{16}/cm^3$. The first carrier density Ca of the channel region 4Ac of the first TFT 10A may be, for example, not less than $1\times10^{17}$ and not more than $1\times10^{19}$. The first carrier density Ca may be not less than 10 times and not more than 1000 times the second carrier density Cb. The plasma treatment for increasing the first carrier density Ca may be performed under the conditions that, for example, the flow rate of the hydrogen gas is 100-1000 sccm, the substrate temperature is 200-300° C., the RF power is 100-200 W, and the pressure is 50-200 Pa. The duration of the plasma treatment may be, for example, 30 s to 200 s. After the plasma treatment, the resultant structure is annealed in the environmental atmosphere at a temperature equal to or higher than 200° C. and equal to or lower than 300° C. for 0.5 to 2 hours. By such a plasma treatment and annealing, the carrier density of the channel region 4Ac of the oxide semiconductor layer 4A (first carrier density Ca) can be controlled to be within the above-described range. Meanwhile, the oxide semiconductor layer 4B is protected by the mask (resist layer) 51 from the plasma so that the carrier density of the oxide semiconductor layer 4B (second carrier density Cb) can be maintained low.

For example, Japanese Laid-Open Patent Publication No. 2008-40343 discloses exposing an oxide semiconductor layer to a reducing plasma so as to decrease the resistance, such that it can be used as an electrical conductor (e.g., as a pixel electrode). In contrast, in the present embodiment, the plasma treatment is performed under such conditions that the resistance of the oxide semiconductor layer is not decreased (the carrier density is not increased) to such a level that it can be used as an electrical conductor. Specifically, the duration of the plasma treatment is reduced, or annealing is performed under predetermined conditions after the plasma treatment, whereby the oxide semiconductor layer can be prevented from changing into an electrical conductor.

Figure 14:
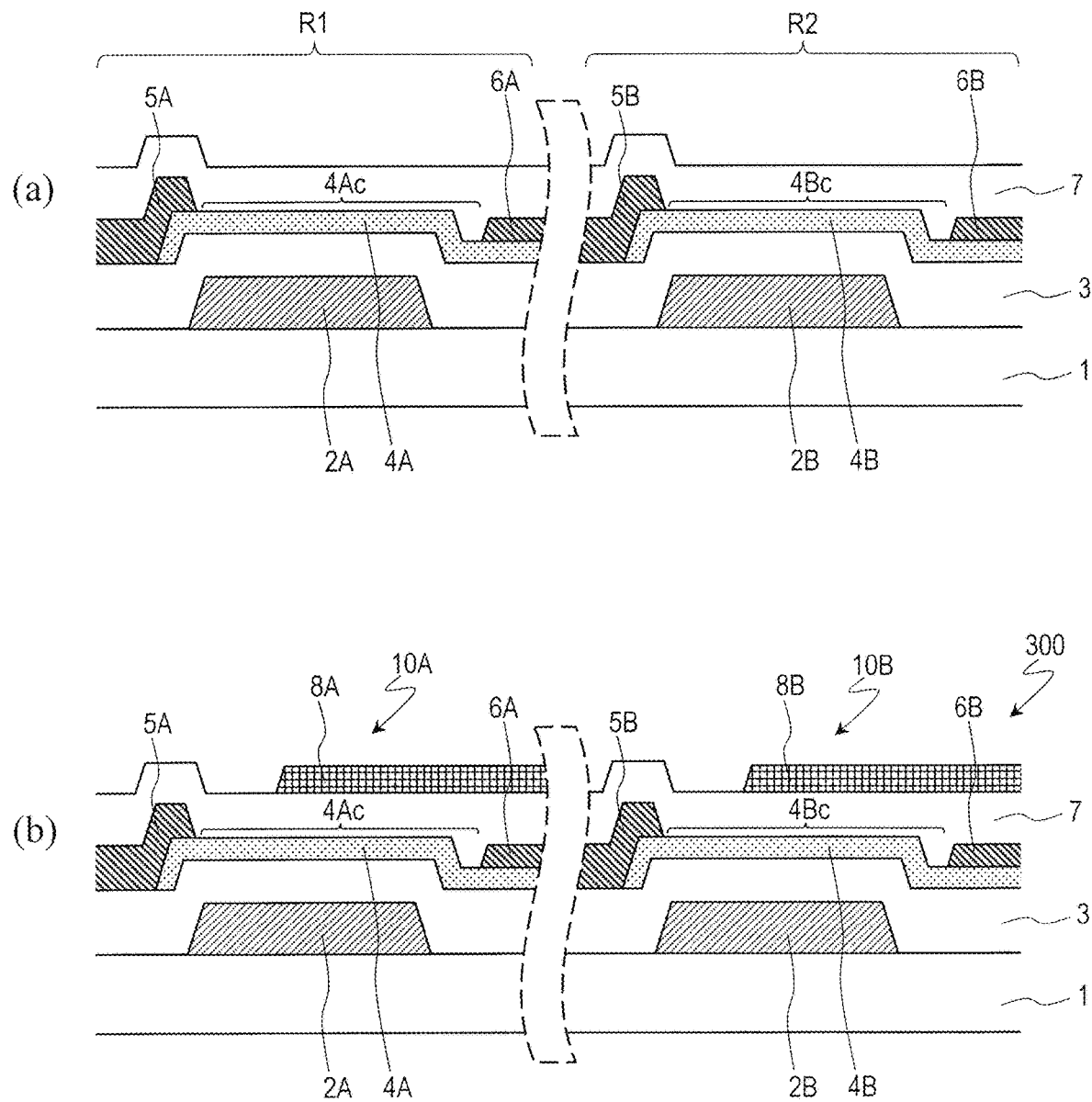
FIG. 14(a) and FIG. 14(b) are stepwise cross-sectional views for illustrating the method of forming the first TFT 10A and the second TFT 10B of the active matrix substrate 300.

Then, the mask 51 is removed, and an insulating layer 7 is formed so as to cover the oxide semiconductor layers 4A, 4B, the source electrodes 5A, 5B and the drain electrodes 6A, 6B as shown in FIG. 14(a). This process can be carried out in the same way as the process shown in FIG. 7(b). Then, a heat treatment is performed in a dry air or atmospheric air at a temperature equal to or higher than 200° C. and equal to or lower than 400° C., for example. The duration of the heat treatment may be, for example, 1 to 2 hours. This heat treatment can reduce the oxygen deficiencies produced in the oxide semiconductor layers 4A, 4B due to formation of the insulating layer 7. Note that this heat treatment and the annealing performed after the plasma treatment can be concurrently carried out.

Thereafter, upper gate electrodes 8A, 8B are formed on the insulating layer 7 as shown in FIG. 14(b). This process can be carried out in the same way as the process shown in FIG. 7(c). As described hereinabove, the first TFT 10A and the second TFT 10B can be formed.

The method of forming the first TFT 10A and the second TFT 10B of the present embodiment is not limited to the foregoing example. The step of making the carrier density of the channel region 4Ac of the oxide semiconductor layer 4A which is present in the first region R1 higher than the carrier density of the channel region 4Bc of the oxide semiconductor layer 4B which is present in the second region R2 may be realized by any other method than the plasma treatment. For example, as will be described later in the following embodiment, the carrier density of the channel region 4Ac can also be increased by selectively supplying hydrogen to part of the insulating layer 7 which is present in the first region R1.

Embodiment 4

The first TFT 10A and the second TFT 10B included in an active matrix substrate of the present embodiment have the same configuration as that of the first TFT 10A and the second TFT 10B shown in FIG. 12. The present embodiment is different from Embodiment 3 in that, by selectively supplying hydrogen to part of the insulating layer 7 which is present in the first region R1, the carrier density of the channel region 4Ac of the first TFT 10A is made higher than the carrier density of the channel region 4Bc of the second TFT 10B.

Figure 15:
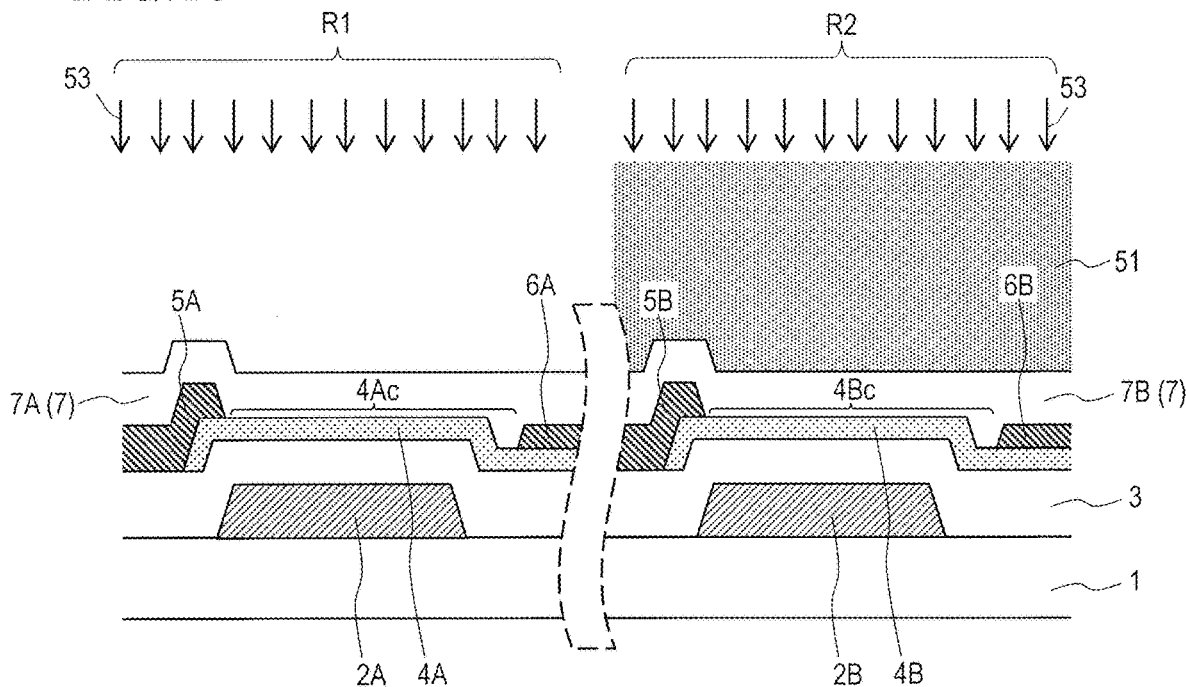
FIG. 15 is a stepwise cross-sectional view for illustrating the method of forming the first TFT 10A and the second TFT 10B included in an active matrix substrate of Embodiment 4.

FIG. 15 is a cross-sectional view for illustrating the method of forming the first TFT 10A and the second TFT 10B of the present embodiment.

First, in respective ones of the first region R1 and the second region R2, gate electrodes 2A, 2B, a gate insulating layer 3, oxide semiconductor layers 4A, 4B, source electrodes 5A, 5B and drain electrodes 6A, 6B are sequentially formed. These steps can be carried out in the same way as the process shown in FIG. 6(a) to FIG. 7(a).

Then, an oxygen-donating layer (e.g., silicon oxide layer) is formed as the insulating layer 7 on the oxide semiconductor layers 4A, 4B, the source electrodes 5A, 5B and the drain electrodes 6A, 6B in the same way as the process shown in FIG. 7(b).

Then, as shown in FIG. 15, a mask (resist layer) 51 is formed so as to cover the second region R2 and to have an opening above the first region R1. The resultant structure is subjected to a plasma treatment from above the mask 51. Herein, plasma 53 is applied using a reducing gas, such as hydrogen gas, in a plasma CVD apparatus. Thereby, hydrogen is introduced into the first part 7A of the insulating layer 7 which is present in the first region R1. Since the second part 7B of the insulating layer 7 which is present in the second region R2 is protected with the mask 51, introduction of hydrogen into the second part 7B is suppressed. Therefore, the first part 7A of the insulating layer 7 which is present on the first TFT 10A contains hydrogen at a higher concentration than the second part 7B which is present on the second TFT 10B. The plasma treatment may be performed under the conditions that, for example, the flow rate of the hydrogen gas is 100-1000 sccm, the substrate temperature is 200-300° C., the RF power is 100-1000 W, and the pressure is 50-200 Pa. The duration of the plasma treatment may be, for example, 30 to 600 s.

Thereafter, a heat treatment is performed in a dry air or atmospheric air at 200-400° C. (preferably, 200-300° C.) for 0.5 to 2 hours (preferably, 1 to 2 hours) in the same way as the above-described method. Part of the hydrogen supplied to the first part 7A of the insulating layer 7 by the heat treatment diffuses to the oxide semiconductor layer 4A. Therefore, in the channel region 4Ac that is in contact with the first part 7A, oxygen deficiencies are produced by reduction with hydrogen so that the carrier density increases. As a result, the first carrier density Ca of the channel region 4Ac can be higher than the second carrier density Cb of the channel region 4Bc.

Also in the present embodiment, the first carrier density Ca may be, for example, not more than $1 \times 10^{17}$ and not more than $1 \times 10^{19}$. The first carrier density Ca may be not less than 10 times and not more than 1000 times the second carrier density Cb. The first carrier density Ca can be controlled according to, for example, the conditions of the plasma treatment on the first part 7A of the insulating layer 7. For example, the first carrier density Ca can be controlled to be within the above-described range by performing a heat treatment at, for example, 200-300° C. after the plasma treatment is performed under the above-described conditions.

The method of supplying hydrogen to the insulating layer 7 is not limited to the plasma treatment but may be ion doping.

(Configuration and Operation of Demultiplexer Circuit)

The first TFT 10A of Embodiments 3 and 4 can be suitably used as, for example, a switching element (DMX circuit TFT) of a demultiplexer circuit DMX provided in the peripheral region of a display device. In a demultiplexer circuit described herein, the first TFT 10A is used.

Figure 16:
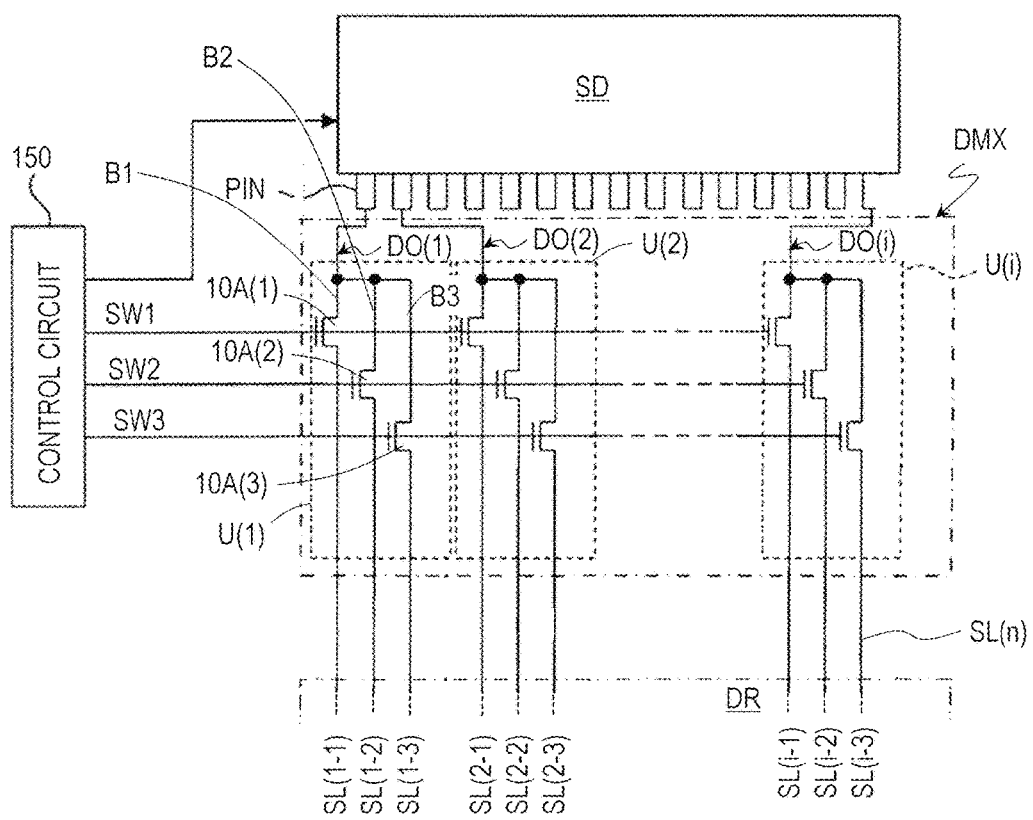
FIG. 16 is a diagram for illustrating the configuration and operation of a demultiplexer circuit DMX.

FIG. 16 is a diagram for illustrating the configuration and operation of the demultiplexer circuit DMX.

The demultiplexer circuit DMX is provided between the source driver SD and the display region DR. The demultiplexer circuit DMX includes a plurality of unit circuits U(1) to U(i) (i is an integer not less than 2) (hereinafter, also generically referred to as "unit circuits U"). The demultiplexer circuit DMX and the source driver SD are controlled by a control circuit 150 provided in the non-display region FR.

Each of the output pins PIN of the source driver SD is connected with any of a plurality of video signal lines DO(1) to DO(i) (also generically referred to as "video signal lines DO"). A group of n source bus lines SL (n is an integer not less than 2, herein n=3) are associated with a single video signal line DO. Between the video signal lines DO and the groups of source bus lines SL, the unit circuits U are provided for respective video signal lines. The unit circuit U distributes video data from a single video signal line DO to n source bus lines SL.

In this specification, the $N^{th}$ one of the plurality of video signal lines DO(1) to DO(i) is a video signal line DO(N) (N is an integer from 1 to i), and a unit circuit U and source bus lines SL associated with the video signal line DO(N) are a unit circuit U(N) and source bus lines SL(N−1) to SL (M−n). The source bus lines SL(N−1) to SL(N−n) may be associated with, for example, R, G, B pixels (i.e., n=3).

Each unit circuit U(N) includes n branch wires B1 to Bn connected with the video signal line DO(N), n control signal lines SW1 to SWn, and n DMX circuit TFTs 10A(1) to 10A(n) (hereinafter, also generically referred to as "DMX circuit TFTs 10A". The control signal lines SW1 to SWn are connected with the control circuit 150.

The DMX circuit TFT 10A functions as a selection switch. The gate electrode of the DMX circuit TFT 10A is electrically coupled with a corresponding one of the control signal lines SW1 to SWn. The source electrode of the DMX circuit TFT 10A is electrically coupled with a corresponding one of the branch wires B1 to Bn. The drain electrode of the DMX circuit TFT 10A is connected with a corresponding one of the source bus lines SL(N−1) to SL(N−3).

The gate electrodes of the DMX circuit TFTs 10A are supplied with selection signals from the control signal lines SW1 to SW3. The selection signals define the ON periods of the selection switches in the same group and are in synchronization with the time-series signal output from the source driver SD. The unit circuit U(N) writes data potentials resulting from time-division multiplexing of the output of the video signal line DO(N) in a plurality of source bus lines SL(N−1) to SL(N−n) in a time-series manner (time-division driving). Due to this, the number of the output pins PIN of the source driver SD can be reduced and, therefore, the area of the non-display region FR can be further reduced (narrowing of frame).

The operation of a display device with the use of the demultiplexer circuit DMX and the timing chart of the time-division driving are disclosed in, for example, Japanese Laid-Open Patent Publication No. 2008-225036, Japanese Laid-Open Patent Publication No. 2006-119404 and WO 2011/118079. The entire disclosures of Japanese Laid-Open Patent Publication No. 2008-225036, Japanese Laid-Open Patent Publication No. 2006-119404 and WO 2011/118079 are incorporated by reference in this specification.

<Oxide Semiconductor>

The oxide semiconductor included in the oxide semiconductor layer 4 (or 4A, 4B) may be an amorphous oxide semiconductor or may be a crystalline oxide semiconductor which includes a crystalline portion. Examples of the crystalline oxide semiconductor include a polycrystalline oxide semiconductor, a microcrystalline oxide semiconductor, and a crystalline oxide semiconductor in which the c-axis is oriented generally perpendicular to the layer surface.

The materials, structures and film formation methods of the non-crystalline oxide semiconductor and the respective aforementioned crystalline oxide semiconductors, and the configuration of the oxide semiconductor layer which has a multilayer structure, are disclosed in, for example, Japanese Laid-Open Patent Publication No. 2014-007399. The entire disclosure of Japanese Laid-Open Patent Publication No. 2014-007399 is incorporated by reference in this specification.

The oxide semiconductor layer 4 (4A, 4B) may include, for example, at least one metal element among In, Ga and Zn. In the present embodiment, the oxide semiconductor layer 4 (4A, 4B) includes, for example, an In—Ga—Zn—O based semiconductor (e.g., indium gallium zinc oxide). Here, the In—Ga—Zn—O based semiconductor is a ternary oxide including In (indium), Ga (gallium) and Zn (zinc). The proportion (composition ratio) of In, Ga and Zn is not particularly limited but includes, for example, In:Ga:Zn=2: 2:1, In:Ga:Zn=1:1:1, and In:Ga:Zn=1:1:2. The oxide semiconductor layer which has such a composition can be formed by an oxide semiconductor film which includes an In—Ga—Zn—O based semiconductor.

The In—Ga—Zn—O based semiconductor may be amorphous or may be crystalline. As the crystalline In—Ga—Zn—O based semiconductor, a crystalline In—Ga—Zn—O based semiconductor in which the c-axis is oriented generally perpendicular to the layer surface is preferred.

The crystalline structure of the crystalline In—Ga—Zn—O based semiconductor is disclosed in, for example, aforementioned Japanese Laid-Open Patent Publication No. 2014-007399, Japanese Laid-Open Patent Publication No. 2012-134475, and Japanese Laid-Open Patent Publication No. 2014-209727. The entire disclosures of Japanese Laid-Open Patent Publication No. 2012-134475 and Japanese Laid-Open Patent Publication No. 2014-209727 are incorporated by reference in this specification. A TFT which includes an In—Ga—Zn—O based semiconductor layer has high mobility (20 times or more as compared with an a-Si TFT) and low current leakage (less than 1/100 as compared with an a-Si TFT), and is therefore suitably used as a driver TFT (e.g., a TFT included in a driving circuit provided around the display region including a plurality of pixels on the same substrate as the display region) and a pixel TFT (a TFT provided in a pixel).

The oxide semiconductor layer 4 (4A, 4B) may contain a different oxide semiconductor instead of the In—Ga—Zn—O based semiconductor. For example, the oxide semiconductor layer 4 (4A, 4B) may contain an In—Sn—Zn—O based semiconductor (e.g., $In_2O_3$—$SnO_2$—ZnO; InSnZnO). In—Sn—Zn—O based semiconductor is a ternary oxide including In (indium), Sn (tin) and Zn (zinc). Alternatively, the oxide semiconductor layer 7 (or 7A, 7B) may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, or the like.

INDUSTRIAL APPLICABILITY

The embodiments of the present invention are suitably applicable to an active matrix substrate which includes oxide semiconductor TFTs. Such an active matrix substrate is applicable to display devices such as liquid crystal display devices, organic electroluminescence (EL) display devices, and inorganic electroluminescence display devices, imaging devices such as image sensor devices, and various electronic devices such as image input devices, fingerprint readers, and semiconductor memories.

REFERENCE SIGNS LIST 1 substrate
2, 2A, 2B lower gate electrode
3 gate insulating layer
4, 4A, 4B oxide semiconductor layer
4c, 4Ac, 4Bc channel region
4s source contact region
4d drain contact region
5, 5A, 5B source electrode
6, 6A, 6B drain electrode
7 insulating layer (passivation layer)
8, 8A, 8B upper gate electrode
9 organic insulating layer (planarization layer)
10 oxide semiconductor TFT
10A first TFT
10B second TFT
51 mask
53 plasma
100, 100A, 200, 300 active matrix substrate
150 control circuit
B branch wire
$C_{LC}$ liquid crystal capacitance
Cs storage capacitance
DMX demultiplexer circuit
DR display region
FR non-display region
GD gate driver
GL gate bus line
PE pixel electrode
PIX pixel region
Pt pixel TFT
R1 first region
R2 second region
SD source driver
SL source bus line
SW control signal line
U unit circuit of demultiplexer circuit

The invention claimed is:

1. An active matrix substrate having a display region defined by a plurality of pixel regions, the active matrix substrate comprising a substrate and a plurality of oxide semiconductor TFTs supported on the substrate,
wherein each of the plurality of oxide semiconductor TFTs includes
a lower gate electrode provided on the substrate,
a gate insulating layer covering the lower gate electrode,
an oxide semiconductor layer provided on the gate insulating layer, the oxide semiconductor layer overlapping the lower gate electrode with the gate insulating layer interposed therebetween, the oxide semiconductor layer including a channel region and a source contact region and a drain contact region which are present on opposite sides of the channel region,
a source electrode which is in contact with the source contact region of the oxide semiconductor layer,
a drain electrode which is in contact with the drain contact region of the oxide semiconductor layer,
an insulating layer covering the oxide semiconductor layer, the source electrode and the drain electrode, and
an upper gate electrode provided on the insulating layer, the upper gate electrode overlapping the oxide semiconductor layer with the insulating layer interposed therebetween, wherein
when viewed in a normal direction of the substrate, the upper gate electrode does not overlap a first electrode which is one of the source electrode and the drain electrode, and a second electrode which is the other of the source electrode and the drain electrode does not overlap the lower gate electrode; and
when viewed in the normal direction of the substrate, the oxide semiconductor layer:
(a) includes a region neighboring the source contact region which overlaps the lower gate electrode but does not overlap the upper gate electrode and a region neighboring the drain contact region which overlaps the upper electrode but does not overlap the lower gate electrode; or
(b) includes a region neighboring the drain contact region which overlaps the lower gate electrode but does not overlap the upper gate electrode and a region neighboring the source contact region which overlaps the upper gate electrode but does not overlap the lower gate electrode.

2. The active matrix substrate of claim 1, wherein
the upper gate electrode is arranged such that a static capacitance formed between the upper gate electrode and the first electrode is not more than 80% of a static capacitance formed between the upper gate electrode and the second electrode, and
the second electrode is arranged such that a static capacitance formed between the second electrode and the lower gate electrode is not more than 80% of a static capacitance formed between the first electrode and the lower gate electrode.

3. The active matrix substrate of claim 1, wherein when viewed in the normal direction of the substrate, an end of the upper gate electrode on the first electrode side and an end of the first electrode on the upper gate electrode side are spaced away from each other by 2 μm or more.

4. The active matrix substrate of claim 1, wherein when viewed in the normal direction of the substrate, an end of the second electrode on the lower gate electrode side and an end of the lower gate electrode on the second electrode side are spaced away from each other by 2 μm or more.

5. The active matrix substrate of claim 1, wherein a thickness of the oxide semiconductor layer is not more than 10 μm.

6. The active matrix substrate of claim 1, wherein the plurality of oxide semiconductor TFTs include a plurality of pixel TFTs provided in the plurality of pixel regions.

7. The active matrix substrate of claim 1, wherein the active matrix substrate has a non-display region lying around the display region, the active matrix substrate further includes a peripheral circuit provided in the non-display region, the plurality of oxide semiconductor TFTs include a plurality of first TFTs provided in the non-display region and included in the peripheral circuit and a plurality of second TFTs provided in the display region or the non-display region, the oxide semiconductor layer of the plurality of first TFTs and the oxide semiconductor layer of the plurality of second TFTs are formed by an identical oxide semiconductor film, and a carrier density in the channel region of the plurality of first TFTs is higher than a carrier density in the channel region of the plurality of second TFTs.

8. The active matrix substrate of claim 7, wherein the peripheral circuit is a demultiplexer circuit.

9. The active matrix substrate of claim 1, wherein the oxide semiconductor layer includes an In—Ga—Zn—O based semiconductor.

10. The active matrix substrate of claim 9, wherein the In—Ga—Zn—O based semiconductor includes a crystalline portion.

11. A display device comprising the active matrix substrate as set forth in claim 1.

12. An active matrix substrate having a display region defined by a plurality of pixel regions, the active matrix substrate comprising a substrate and a plurality of oxide semiconductor TFTs supported on the substrate, wherein each of the plurality of oxide semiconductor TFTs includes
a lower gate electrode provided on the substrate,
a gate insulating layer covering the lower gate electrode,
an oxide semiconductor layer provided on the gate insulating layer, the oxide semiconductor layer overlapping the lower gate electrode with the gate insulating layer interposed therebetween, the oxide semiconductor layer including a channel region and a source contact region and a drain contact region which are present on opposite sides of the channel region,
a source electrode which is in contact with the source contact region of the oxide semiconductor layer,
a drain electrode which is in contact with the drain contact region of the oxide semiconductor layer,
an insulating layer covering the oxide semiconductor layer, the source electrode and the drain electrode, and
an upper gate electrode provided on the insulating layer, the upper gate electrode overlapping the oxide semiconductor layer with the insulating layer interposed therebetween, wherein when viewed in a normal direction of the substrate, the upper gate electrode does not overlap a first electrode which is one of the source electrode and the drain electrode, and a second electrode which is the other of the source electrode and the drain electrode does not overlap the lower gate electrode, the upper gate electrode is arranged such that a static capacitance formed between the upper gate electrode and the first electrode is not more than 80% of a static capacitance formed between the upper gate electrode and the second electrode, and the second electrode is arranged such that a static capacitance formed between the second electrode and the lower gate electrode is not more than 80% of a static capacitance formed between the first electrode and the lower gate electrode.

13. An active matrix substrate having a display region defined by a plurality of pixel regions, the active matrix substrate comprising a substrate and a plurality of oxide semiconductor TFTs supported on the substrate, wherein each of the plurality of oxide semiconductor TFTs includes
a lower gate electrode provided on the substrate,
a gate insulating layer covering the lower gate electrode,
an oxide semiconductor layer provided on the gate insulating layer, the oxide semiconductor layer overlapping the lower gate electrode with the gate insulating layer interposed therebetween, the oxide semiconductor layer including a channel region and a source contact region and a drain contact region which are present on opposite sides of the channel region,
a source electrode which is in contact with the source contact region of the oxide semiconductor layer,
a drain electrode which is in contact with the drain contact region of the oxide semiconductor layer,
an insulating layer covering the oxide semiconductor layer, the source electrode and the drain electrode, and
an upper gate electrode provided on the insulating layer, the upper gate electrode overlapping the oxide semiconductor layer with the insulating layer interposed therebetween, wherein when viewed in a normal direction of the substrate, the upper gate electrode does not overlap a first electrode which is one of the source electrode and the drain electrode, and a second electrode which is the other of the source electrode and the drain electrode does not overlap the lower gate electrode, the active matrix substrate has a non-display region lying around the display region, the active matrix substrate further includes a peripheral circuit provided in the non-display region, the plurality of oxide semiconductor TFTs include a plurality of first TFTs provided in the non-display region and included in the peripheral circuit and a plurality of second TFTs provided in the display region or the non-display region, the oxide semiconductor layer of the plurality of first TFTs and the oxide semiconductor layer of the plurality of second TFTs are formed by an identical oxide semiconductor film, and a carrier density in the channel region of the plurality of first TFTs is higher than a carrier density in the channel region of the plurality of second TFTs.

* * * * *